United States Patent
Feng et al.

(10) Patent No.: US 12,027,099 B2
(45) Date of Patent: *Jul. 2, 2024

(54) SHIFT-REGISTER UNIT, GATE-DRIVING CIRCUIT, DISPLAY APPARATUS, AND DRIVING METHOD

(71) Applicants: Hefei BOE Joint Technology Co.,Ltd., Anhui (CN); BOE Technology Group Co., Ltd., Beijing (CN)

(72) Inventors: Xuehuan Feng, Beijing (CN); Yongqian Li, Beijing (CN); Xing Zhang, Beijing (CN)

(73) Assignees: Hefei BOE Joint Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/325,140

(22) Filed: May 30, 2023

(65) Prior Publication Data

US 2023/0306892 A1 Sep. 28, 2023

Related U.S. Application Data

(63) Continuation of application No. 17/721,234, filed on Apr. 14, 2022, now Pat. No. 11,705,047, which is a (Continued)

(30) Foreign Application Priority Data

Aug. 23, 2018 (CN) .......................... 201810966800.7

(51) Int. Cl.
G09G 3/20 (2006.01)
(52) U.S. Cl.
CPC ... *G09G 3/2092* (2013.01); *G09G 2310/0286* (2013.01); *G09G 2310/061* (2013.01); *G09G 2310/08* (2013.01)

(58) Field of Classification Search
CPC ......... G09G 3/2092; G09G 2310/0286; G09G 2310/061; G09G 2310/08;
(Continued)

(56) References Cited

U.S. PATENT DOCUMENTS 9,472,155 B2 * 10/2016 Xiao ...................... G11C 19/28
2006/0139293 A1 6/2006 Cho et al.
(Continued)

FOREIGN PATENT DOCUMENTS

CN 1534583 A 10/2004
CN 103050106 A 4/2013
(Continued)

OTHER PUBLICATIONS

First Office Action in the Japanese Patent Application No. 2020561712, dated Jun. 6, 2023; English translation attached.
(Continued)

*Primary Examiner* — Matthew A Eason
*Assistant Examiner* — Sujit Shah
(74) *Attorney, Agent, or Firm* — Intellectual Valley Law, P.C.

(57) ABSTRACT

A shift-register unit includes a first circuit including a first input circuit coupled via a first node to a first output circuit, and a second circuit including a second input circuit coupled via a second node to a second output circuit. The first input circuit is configured to control a voltage level of the first node in response to a first input signal. The first output circuit is configured to output a shift-register signal and a first output signal in response to the voltage level of the first node. The second input circuit is configured to control a voltage level of the second node in response to the first input signal. The second output circuit is configured to output a second output signal in response to the voltage level of the
(Continued)

second node. The first input circuit and the second input circuit have a same circuit structure.

17 Claims, 25 Drawing Sheets

Related U.S. Application Data continuation of application No. 16/618,106, filed as application No. PCT/CN2019/094395 on Jul. 2, 2019, now Pat. No. 11,373,577.

(58) Field of Classification Search
CPC ... G09G 2310/0283; G09G 2310/0294; G09G 2310/0291; G09G 2310/0289
See application file for complete search history.

(56) References Cited

U.S. PATENT DOCUMENTS

| | | | |
|---|---|---|---|
| 2014/0062847 A1* | 3/2014 | Chien | G11C 19/28 345/100 |
| 2014/0111495 A1 | 4/2014 | Iwase et al. | |
| 2014/0176410 A1* | 6/2014 | Ma | G09G 3/3677 327/109 |
| 2016/0247476 A1* | 8/2016 | Xiao | G11C 19/28 |
| 2016/0358666 A1* | 12/2016 | Pang | G09G 3/3688 |
| 2017/0186360 A1 | 6/2017 | Ma et al. | |
| 2017/0186373 A1 | 6/2017 | Nishikawa et al. | |
| 2017/0206824 A1 | 7/2017 | Sun | |
| 2018/0090090 A1 | 3/2018 | Feng et al. | |
| 2018/0096644 A1 | 4/2018 | Jang et al. | |
| 2020/0143766 A1* | 5/2020 | Zhang | G09G 3/3677 |
| 2021/0158742 A1 | 5/2021 | Feng et al. | |

FOREIGN PATENT DOCUMENTS

| | | | |
|---|---|---|---|
| CN | 103503057 | A | 1/2014 |
| CN | 104978922 | A | 10/2015 |
| CN | 105761663 | A | 7/2016 |
| CN | 106023943 | A | 10/2016 |
| CN | 106098102 | A | 11/2016 |
| CN | 106157912 | A | 11/2016 |
| CN | 107068088 | A | 8/2017 |
| CN | 107452350 | A | 12/2017 |
| CN | 107886886 | A | 4/2018 |
| CN | 109935199 | A | 6/2019 |
| JP | 2016009156 | A | 1/2016 |
| WO | 2015190407 | A1 | 12/2015 |

OTHER PUBLICATIONS

International Search Report & Written Opinion mailed Sep. 26, 2019, regarding PCT/CN2019/094395.
First Office Action in the Chinese Patent Application No. 201810966800.7, dated Sep. 2, 2020; English translation attached.
First Office Action in the Indian Patent Application No. 202027047288, dated Aug. 30, 2021.
Non-Final Office Action in the U.S. Appl. No. 16/618,106, dated Sep. 20, 2021.
Response to Non-Final Office Action in the U.S. Appl. No. 16/618,106, dated Nov. 5, 2021.
Notice of Allowance in the U.S. Appl. No. 16/618,106, dated Feb. 9, 2022.
The Extended European Search Report in the European Patent Application No. 19839090.8, dated Mar. 30, 2022.
Non-Final Office Action in the U.S. Appl. No. 17/721,234, dated Jan. 4, 2023.
Response to Non-Final Office Action in the U.S. Appl. No. 17/721,234, dated Mar. 6, 2023.
Notice of Allowance in the U.S. Appl. No. 17/721,234, dated Jul. 5, 2023.
Office Action in the Korean Patent Application No. 20207037250, dated Oct. 31, 2022; English translation attached.

* cited by examiner

SHIFT-REGISTER UNIT, GATE-DRIVING CIRCUIT, DISPLAY APPARATUS, AND DRIVING METHOD

CROSS-REFERENCE TO RELATED APPLICATION

This application is a continuation of U.S. application Ser. No. 17/721,234, filed Apr. 14, 2022, which is a continuation of U.S. application Ser. No. 16/618,106, filed Jul. 2, 2019, which a national stage application under 35 U.S.C. § 371 of International Application No. PCT/CN2019/094395, filed Jul. 2, 2019, which claims priority to Chinese Patent Application No. 201810966800.7, filed Aug. 23, 2018. Each of the forgoing applications is herein incorporated by reference in its entirety for all purposes.

TECHNICAL FIELD

The present invention relates to display technology, more particularly, to a shift-register unit, a gate-driving circuit, a display apparatus, and driving method.

BACKGROUND

In a display panel, especially for one based on Organic Light-Emitting Diode (OLED), the driving circuit is typically integrated in a Gate Integrated Circuit (Gate IC). When designing a chip of the Gate IC, the cost of the chip is mainly depended on the area of the chip. Existing OLED gate-driving circuit includes three sub-circuits, i.e., a sense unit circuit, a scan unit circuit, and a connection circuit or a gate circuit for outputting signals from both the sense unit circuit and the scan unit circuit, making the Gate IC to be a very complex circuit structure and hard to meet more and more stringent requirement to produce a high resolution OLED display panel with a narrow frame boarder. Therefore, an improved circuitry design for the shift-register unit to form gate-driving circuit of the display panel are desired.

SUMMARY

In an aspect, the present disclosure provides a shift-register unit. The shift-register unit includes a first circuit comprising a first input circuit coupled via a first node to a first output circuit, the first input circuit being configured to control a voltage level of the first node and the first output circuit being configured to output a first output signal in response to the voltage level of the first node; a second circuit comprising a second input circuit coupled via a second node to a second output circuit, the second input circuit being configured to control a voltage level of the second node and the second output circuit being configured to output a second output signal in response to the voltage level of the second node; and a blank-input circuit coupled to the first node and the second node, and being configured to receive a select-control signal to control voltage levels of the first node and the second node; wherein the first input circuit and the second input circuit have a same circuit structure; the first output signal and the second output signal are different from each other; the blank-input circuit comprises a common-input circuit, a first transport circuit, and a second transport circuit; the common-input circuit being configured to control a voltage level of a fourth node; the first transport circuit being coupled to the first node and the fourth node, and being configured to control the voltage level of the first node; and the second transport circuit being coupled to the second node and the fourth node, and being configured to control the voltage level of the second node.

Optionally, the blank-input circuit includes a common-input circuit, a first transport circuit, and a second transport circuit. The common-input circuit is configured to control a voltage level of a third node in response to the select-control signal and to control a voltage level of a fourth node. The first transport circuit is coupled to the first node and the fourth node, and is configured to control the voltage level of the first node in response to the voltage level of the fourth node or a first transport signal. The second transport circuit is coupled to the second node and the fourth node, and is configured to control the voltage level of the second node in response to the voltage level of the fourth node or a second transport signal.

Optionally, the common-input circuit further includes a select-control circuit and a third input circuit. The select-control circuit is configured to use a second input signal to control the voltage level of the third node in response to the select-control signal, and to maintain the voltage level of the third node. The third input circuit is configured to control the voltage level of the fourth node in response to the voltage level of the third node.

Optionally, the select-control circuit includes a first transistor and a first capacitor. The first transistor has a gate terminal configured to receive the select-control signal, a first terminal configured to receive the second input signal, and a second terminal coupled to the third node. The first capacitor has a first terminal coupled to the third node.

Optionally, the third input circuit comprises a second transistor having a gate coupled to the third node and a second terminal coupled to the fourth node.

Optionally, the third input circuit includes a second transistor having a gate coupled to the third node, a first terminal configured to receive a first clock signal, and a second terminal coupled to the fourth node.

Optionally, the first transport circuit includes a third transistor and the second transport circuit includes a fourth transistor. The third transistor has a gate terminal coupled the fourth node, and a first terminal configured to receive a first voltage, and a second terminal coupled to the first node. The fourth transistor has a gate terminal coupled to the fourth node, a first terminal configured to receive the first voltage, and a second terminal coupled to the second node.

Optionally, the first input circuit includes a fifth transistor and the first output circuit includes a sixth transistor, a seventh transistor, and a second capacitor. The fifth transistor has a gate terminal configured to receive the first input signal and a second terminal coupled to the first node. The sixth transistor has a gate terminal coupled to the first node, a first terminal configured to receive a second clock signal as a shift-register signal, and a second terminal configured to output the shift-register signal. The seventh transistor has a gate terminal coupled to the first node, a first terminal configured to receive a third clock signal as the first output signal, and a second terminal configured to output the first output signal. The second capacitor has a first terminal coupled to the first node and a second terminal coupled to the second terminal of the seventh transistor.

Optionally, the second input circuit includes an eighth transistor and the second output circuit includes a ninth transistor and a third capacitor. The eighth transistor has a gate terminal configured to receive the first input signal and a second terminal coupled to the second node. The ninth transistor has a fate terminal coupled to the second node, a first terminal configured to receive a fourth clock signal as the second output signal, and a second terminal configured to output the second output signal. The third capacitor has a first terminal coupled to the second node and a second terminal coupled to the second terminal of the ninth transistor.

Optionally, the first circuit further includes a first control circuit, a first reset circuit, a second reset circuit, a shift-register output terminal, and a first output terminal. The first control circuit is configured to control a voltage level of a fifth node in response to the voltage level at the first node and a second voltage. The first reset circuit is configured to reset voltage levels at the first node, the shift-register output terminal, and the first output terminal in response to the voltage level at the fifth node. The second reset circuit is configured to reset voltage levels at the first node, the shift-register output terminal, and the first output terminal in response to a voltage level at a sixth node.

Optionally, the second circuit further includes a second control circuit, a third reset circuit, a fourth reset circuit, and a second output terminal. The second output terminal is configured to output the second output signal. The second control circuit is configured to control the voltage level of the sixth node in response to the voltage level at the second node and a third voltage. The third reset circuit is configured to reset voltage levels at the second node and the second output terminal in response to the voltage level of the sixth node. The fourth reset circuit is configured to reset voltage levels at the second node and the second output terminal in response to the voltage level of the fifth node.

Optionally, the blank-input circuit further includes a common-reset circuit coupled to the fourth node, the fifth node, and the sixth node, and is configured to reset the voltage level of the fourth node in response to the voltage level at the fifth node or the sixth node.

Optionally, the common-reset circuit includes a tenth transistor and an eleventh transistor. The tenth transistor has a gate terminal coupled to the fifth node, a first terminal coupled to the fourth node, and a second terminal configured to receive a fourth voltage. The eleventh transistor has a gate terminal coupled to the sixth node, a first terminal coupled to the fourth node, and a second terminal configured to receive the fourth voltage.

Optionally, the first control circuit includes a twelfth transistor and a thirteenth transistor. The first reset circuit includes a fourteenth transistor, a fifteenth transistor, and a sixteenth transistor. The second reset circuit includes a seventeenth transistor, an eighteenth transistor, and a nineteenth transistor. The twelfth transistor has a gate terminal and a first terminal commonly configured to receive the second voltage, and a second terminal coupled to the fifth node. The thirteenth transistor has a gate terminal coupled to the first node, a first terminal coupled to the fifth node, and a second terminal configured to receive a fourth voltage. The fourteenth transistor has a gate terminal coupled to the fifth node, a first terminal coupled to the first node, and a second terminal configured to receive the fourth voltage. The fifteenth transistor has a gate terminal coupled to the fifth node, a first terminal coupled to the shift-register output terminal, and a second terminal configured to receive the fourth voltage. The sixteenth transistor has a gate terminal coupled to the fifth node, a first terminal coupled to the first output terminal, and a second terminal configured to receive a fifth voltage. The seventeenth transistor has a gate terminal coupled to the sixth node, a first terminal coupled to the first node, and a second terminal configured to receive the fourth voltage. The eighteenth transistor has a gate terminal coupled to the sixth node, a first terminal coupled to the shift-register output terminal, and a second terminal configured to receive the fourth voltage. The nineteenth transistor has a gate terminal coupled to the sixth node, a first terminal coupled to the first output terminal, and a second terminal configured to receive the fifth voltage.

Optionally, the second control circuit includes a twentieth transistor and a twenty-first transistor. The third reset circuit includes a twenty-second transistor and a twenty-third transistor; and the fourth reset circuit includes a twenty-fourth transistor and a twenty-fifth transistor. The twentieth transistor has a gate terminal and a first terminal commonly configured to receive the third voltage, and a second terminal coupled to the sixth node. The twenty-first transistor has a gate terminal coupled to the second node, a first terminal coupled to the sixth node, and a second terminal configured to receive a fourth voltage. The twenty-second transistor has a gate terminal coupled to the sixth node, a first terminal coupled to the second node, and a second terminal configured to receive the fourth voltage. The twenty-third transistor has a gate terminal coupled to the sixth node, a first terminal coupled to the second output terminal, and a second terminal configured to receive a fifth voltage. The twenty-fourth transistor has a gate terminal coupled to the fifth node, a first terminal coupled to the second node, and a second terminal configured to receive the fourth voltage. The twenty-fifth transistor has a gate terminal coupled to the fifth node, a first terminal coupled to the second output signal, and a second terminal configured to receive the fifth voltage.

Optionally, the first circuit further includes a third output terminal configured to output a third output signal. The second circuit further includes a fourth output terminal configured to output a fourth output signal. The first reset circuit and the second reset circuit are configured to reset a voltage level at the third output terminal. The third reset circuit and the fourth reset circuit are configured to reset a voltage level at the fourth output terminal.

Optionally, the first circuit further includes a third control circuit and a fourth control circuit. The third control circuit is configured to control the voltage level of the fifth node in response to the first clock signal and the fourth control circuit is configured to control the voltage level of the fifth node in response to the first input signal. The second circuit further includes a fifth control circuit and a sixth control circuit. The fifth control circuit is configured to control the voltage level of the sixth node in response to the first clock signal and the sixth control circuit is configured to control the voltage level of the sixth node in response to the first input signal.

Optionally, the first circuit further includes a fifth reset circuit and a sixth reset circuit. The fifth reset circuit is configured to reset the voltage level at the first node in response to a display-reset signal and the sixth reset circuit is configured to reset the voltage level at the first node in response to a full-scale reset signal. The second circuit further includes a seventh reset circuit and an eighth reset circuit. The seventh reset circuit is configured to reset the voltage level at the second node in response to the display-reset signal and the eighth reset circuit is configured to reset the voltage level at the second node in response to the full-scale reset signal.

Optionally, the shift-register unit further includes a common anti-leak circuit, a first anti-leak circuit, and a second anti-leak circuit. The common anti-leak circuit is connected to the first node and a seventh node, and configured to control a voltage level at the seventh node in response to the voltage level at the first node. The first anti-leak circuit is connected to the seventh node, the first reset circuit, the second reset circuit, the fifth reset circuit, and the sixth reset circuit, and configured to prevent the first node from leaking in response to the voltage level of the seventh node. The second anti-leak circuit is connected to the seventh node, the third reset circuit, the fourth reset circuit, the seventh reset circuit, and the eighth reset circuit, and configured to prevent the second node from leaking in response to the voltage level at the seventh node.

Optionally, the first circuit further comprises a fifth reset circuit and a sixth reset circuit; the fifth reset circuit being configured to reset the voltage level at the first node in response to a display-reset signal and the sixth reset circuit being configured to reset the voltage level at the first node in response to a full-scale reset signal; and the second circuit further comprises a seventh reset circuit and an eighth reset circuit; the seventh reset circuit being configured to reset the voltage level at the second node in response to the display-reset signal and the eighth reset circuit being configured to reset the voltage level at the second node in response to the full-scale reset signal.

Optionally, the voltage level of the first node is the same as the voltage level of the second node.

In another aspect, the present disclosure provides a gate-driving circuit including multiple shift-register units cascaded in series. Each of the multiple shift-register units is the shift-register unit described herein including a pair of first circuit in an odd stage and a second circuit in a next even stage respectively controlled by voltage levels of a first node and a second node. The voltage levels of the first node and the second node are respective controlled by a first transport circuit and a second transport circuit coupled commonly from a common-input circuit. A first circuit of a respective shift-register unit outputs a shift-register signal as a first input signal to drive both the first circuit and the second circuit in a next shift-register unit or as a display-reset signal to drive both the first circuit and the second circuit in one before a previous shift-register unit.

Optionally, the first input signal of at least one stage of first four stages of the gate-driving circuit is a clock signal.

Optionally, the first input signal of at least one stage comprises a carry signal of a corresponding previous stage.

Optionally, the common-input circuit further comprises a select-control circuit and a third input circuit; the select-control circuit being configured to use a second input signal to control a voltage level of a third node in response to the select-control signal, and to maintain the voltage level of the third node; and the second input signal of at least one stage comprises a carry signal of a corresponding previous stage.

In yet another aspect, the present disclosure provides a display apparatus including a gate-driving circuit described herein and multiple subpixel units arranged in an array. A first output signal and a second output signal respectively outputted from a first output circuit and a second output circuit of a respective one shift-register unit in the gate-driving circuit are provided respectively to subpixel units in different rows of the array.

In still another aspect, the present disclosure provides a method of driving the shift-register unit described herein. The method includes inputting a first input signal to a first input circuit of a first circuit of the shift-register unit and a second input circuit of a second circuit of the same shift-register unit; driving the first circuit to control a voltage level of a first node of the first circuit based on the first input signal; coupling a first output circuit to the first node; driving the first circuit to control the first output circuit to output a shift-register signal and a first output signal; driving the second circuit to control a voltage level of a second node of the second circuit based on the first input signal; coupling a second output circuit to the second node; and driving the second circuit to control the second output circuit to output a second output signal; wherein driving the first circuit to control a voltage level of the first node comprises employing a blank-input circuit having a common input circuit to receive a second input signal and a first clock signal to determine a voltage level of a third node and a fourth node and a first transport circuit to control the voltage level of the first node; driving the second circuit to control a voltage level of the second node comprises employing the blank-input circuit further having a second transport circuit to control the voltage level of the second node.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1:
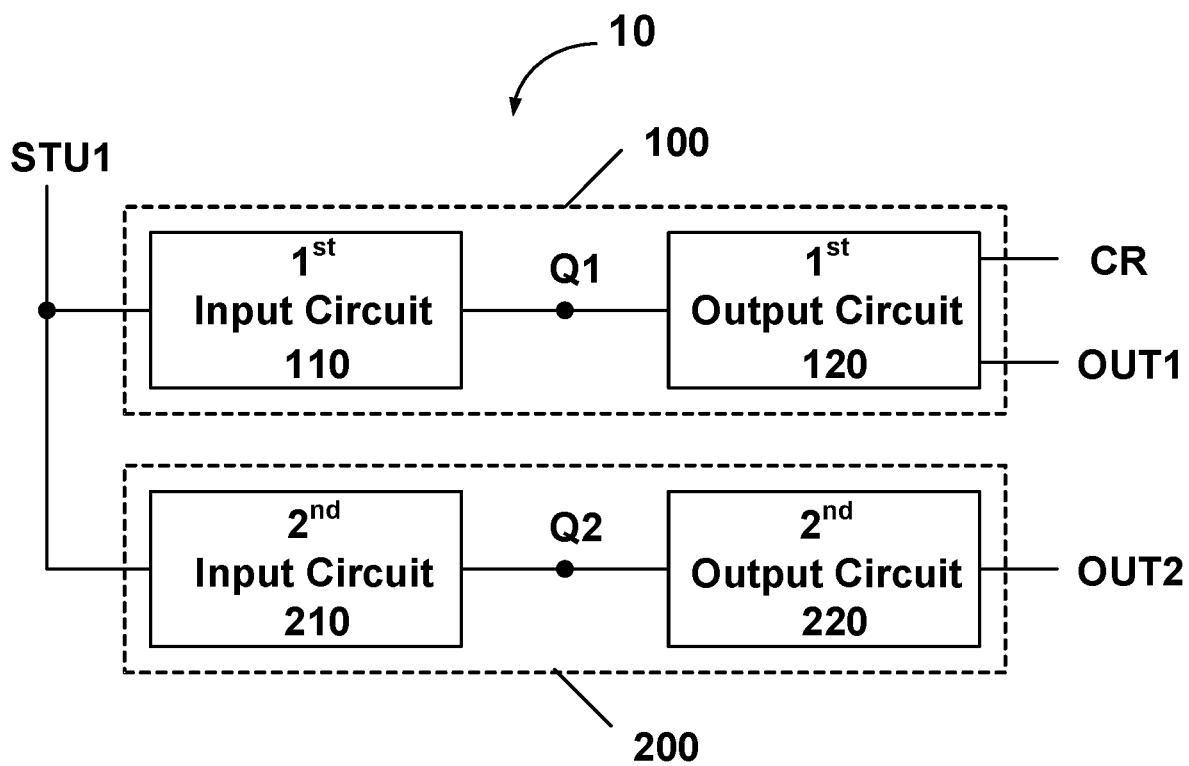
FIG. 1 is a block diagram of a shift-register unit according to an embodiment of the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In the following detailed description, numerous specific details are set forth in order to provide a more thorough understanding of the present disclosure. However, it will be apparent to one skilled in the art that the present disclosure may be practiced without necessarily being limited to these specific details. In other instances, well-known structures devices, and circuits are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, the words "first," "second," and similar terms used in the present disclosure do not denote any order, quantity, or importance, but are used to distinguish different components. Similarly, the words "comprising" or "comprising" or "comprising" or "an" or "an" The words "coupled" or "connected" and the like are not limited to physical or mechanical connections, but may include electrical connections, whether direct or indirect. "Upper", "lower", "left", "right", etc. are only used to indicate the relative positional relationship, and when the absolute position of the object to be described is changed, the relative positional relationship may also change accordingly.

The words "a", "an", "the" and "the" In general, the terms "comprising" and "comprising" are intended to include only the steps and elements that are specifically identified, and the steps and elements do not constitute an exclusive list, and the method or device may also include other steps or elements.

When compensating the sub-pixel unit in the OLED display panel, in addition to setting the pixel compensation circuit for internal compensation in the sub-pixel unit, external compensation can also be performed by setting the sensing transistor. When external compensation is performed, the gate driving circuit composed of the shift register unit needs to supply respective driving signals for the scanning transistor and the sensing transistor to the sub-pixel units in the display panel. For example, in a display period of one cycle of displaying one frame of image, a scanning driving signal for the scanning transistor is provided; while in a blank period of the cycle, a sensing driving signal for the sensing transistor is provided.

In an external compensation method, the sensing driving signals output by the gate-driving circuit are sequentially scanned line by line. For example, a sensing driving signal is outputted to a first row of sub-pixel units in the display panel during a blanking period of a cycle of displaying a first frame, and another sensing driving signal is outputted to a second row of sub-pixel units in the display panel during a blanking period of a cycle of displaying a second frame, and so on. Thus, outputting the sensing driving signal to corresponding one row of the sub-pixel units per frame leads to completion of the line-by-line sequential compensation of the display panel.

Accordingly, the present disclosure provides, inter alia, a shift-register unit configured to be cascaded in series to form a gate-driving circuit that can output a scanning driving signal during a display period of one cycle of displaying one frame and output a sensing driving signal during a blank period of the cycle, a display apparatus, and a driving method that substantially obviate one or more of the problems due to limitations and disadvantages of the related art. In one aspect, the present disclosure provides a shift-register unit suitable for being adopted in a display apparatus with reduced frame size and increased pixels per inch (PPI) of the panel and allowing random compensation to avoid brightness non-uniformity during display operation. Optionally, the first input circuit and the second input circuit have a same circuit structure. Optionally, the first output signal and the second output signal are different from each other.

For the purpose of explanation, definition of "one frame", "per frame" or "a certain frame" includes a display period and a blank period which are sequentially performed. For example, the gate-driving circuit outputs a gate-driving signal during the display period, and the gate-driving signal can be used to drive the display panel by scanning from a first row to a last row to complete a display of one frame. In the blanking period, the gate-driving circuit outputs a sense-driving signal, and the sense-driving signal can be used to drive sensing transistors in a row of sub-pixel units in the display panel to complete external compensation of the row of sub-pixel units.

FIG. 1 is a block diagram of a shift-register unit according to an embodiment of the present disclosure. Referring to FIG. 1, the shift-register unit 10 includes a first circuit 100 and a second circuit 200. Multiple such shift-register units 10 can be cascaded to form a gate-driving circuit according to some embodiments of the present disclosure. The gate-driving circuit can be applied in a display apparatus to provide scanning signals to display one frame of image therein during a display operation.

The first circuit 100 includes a first input circuit 110 and a first output circuit 120 coupled to each other via a first node Q1. The first input circuit 110 is configured to control a voltage level at the first node Q1 in response to a first input signal STU1 received. For example, the first input circuit 110 is able to charge the first node Q1. Optionally, the first input circuit 110 is configured to receive the first input signal STU1 and a first voltage VDD. Optionally, the first input circuit 110 is turned to a conduction state in response to the first input signal STU1 so that the first voltage VDD is utilized for charging the first node Q1. Optionally, the voltage level at the first node Q1 is charged to the level of the first voltage VDD at least within 10% of error. Optionally, the first voltage VDD is set to be a high voltage provided from a power supply.

The first output circuit 120 is configured to output a shift-register signal CR and a first output signal OUT1 in response to the voltage level at the first node Q1. For example, the first output circuit 120 can be configured to receive a second clock signal CLKB and a third clock signal CLKC. The first output circuit 120 is turned to a conduction state in response to the voltage level at the first node Q1 so that the second clock signal CLKB cab be outputted as the shift-register signal CR and the third clock signal CLKC can be outputted as the first output signal OUT1.

Optionally, in a display period of one cycle of displaying one frame of image or simply one frame, the shift-register signal CR outputted from the first output circuit 120 may be provided as a first input signal STU1 to other shift-register unit (in the gate-driving circuit) to complete a line-by-line shift scanning during display operation. The first output signal OUT1 outputted from the first output circuit 120 can drive one row of subpixel units of a display panel to perform display scanning. Optionally, in a blank period of one frame, the first output signal OUT1 outputted from the first output circuit 120 can be used to drive sensing transistors in one row of subpixel units of the display panel to complete external compensations to the one row of subpixel units.

Optionally, during the display period of the frame, the shift-register signal outputted from the first output circuit 120 can have a same, or a different, waveform compared with the first output signal OUT1 outputted from the same first output circuit 120.

Referring to FIG. 1, the second circuit 200 includes a second input circuit 210 and a second output circuit 220 coupled to each other via a second node Q2. The second input circuit 210 is configured to control a voltage level at the second node Q2 in response to the first input signal STU1. For example, the second input circuit 210 is to charge the second node Q2. Optionally, the second input circuit 210 can be configured to receive the first input signal STU1 and the first voltage VDD and is turned on by the first input signal STU1 so that it uses the first voltage VDD to charge the second node Q2.

Optionally, the second output circuit 220 is configured to output a second output signal OUT2 in response to the voltage level at the second node Q2. For example, the second output circuit 220 is configured to receive a fourth clock signal CLKD. The second output circuit 220 is then turned on by the voltage level at the second node Q2 so that it can output the fourth clock signal CLKD as a second output signal OUT2.

In a display period of one frame, the second output circuit 220 outputs the second output signal OUT2 to drive a row of subpixel units of a display panel to perform display scanning. In a blank period of one frame, the second output circuit 220 outputs the second output signal OUT2 to drive sensing transistors in one row of subpixel units of the display panel to complete an external compensation for the one row of subpixel units.

When multiple such shift-register units 10 are cascaded in series to form a gate-driving circuit, some shift-register units 10 can be connected with a clock signal line so as to receive the first input signal STU1 provided with the clock signal line. Optionally, some shift-register units 10 can receive the shift-register signal CR outputted from other stages of shift-register units 10 in the same gate-driving circuit as the first input signal STU1.

Optionally, controlling the level of a node (e.g., first node Q1, second node Q2, etc.), including charging the node to raise the voltage level of the node, or discharging the node to lower the voltage level of the node. Optionally, a capacitor can be electrically connected to the node, and charging the node means charging the capacitor electrically connected to the node. Similarly, discharging the node means discharging the capacitor electrically connected to the node. Discharge. The capacitor can maintain the high or low level of the node.

The shift-register unit 10 of the present disclosure can perform charging to multiple circuits (such as the first circuit 100 and the second circuit 200) at the same time. FIG. 1 only shows two circuits in the shift-register unit. Optionally, the shift-register unit can include three, or four, or more circuits in similar circuitry structures depending on actual setup in different applications. Only one of the multiple circuits (e.g., the first circuit 100) needs to output a shift-register signal at a time, while others of the multiple circuits (e.g., the second circuit 200) need not to output the shift-register signal. Therefore, the number of clock signal lines and transistors in the gate-driving circuit can be saved, reducing border frame size of a display apparatus that adopts the shift-register units 10 thereby enhancing PPI of the display apparatus.

Figure 2:
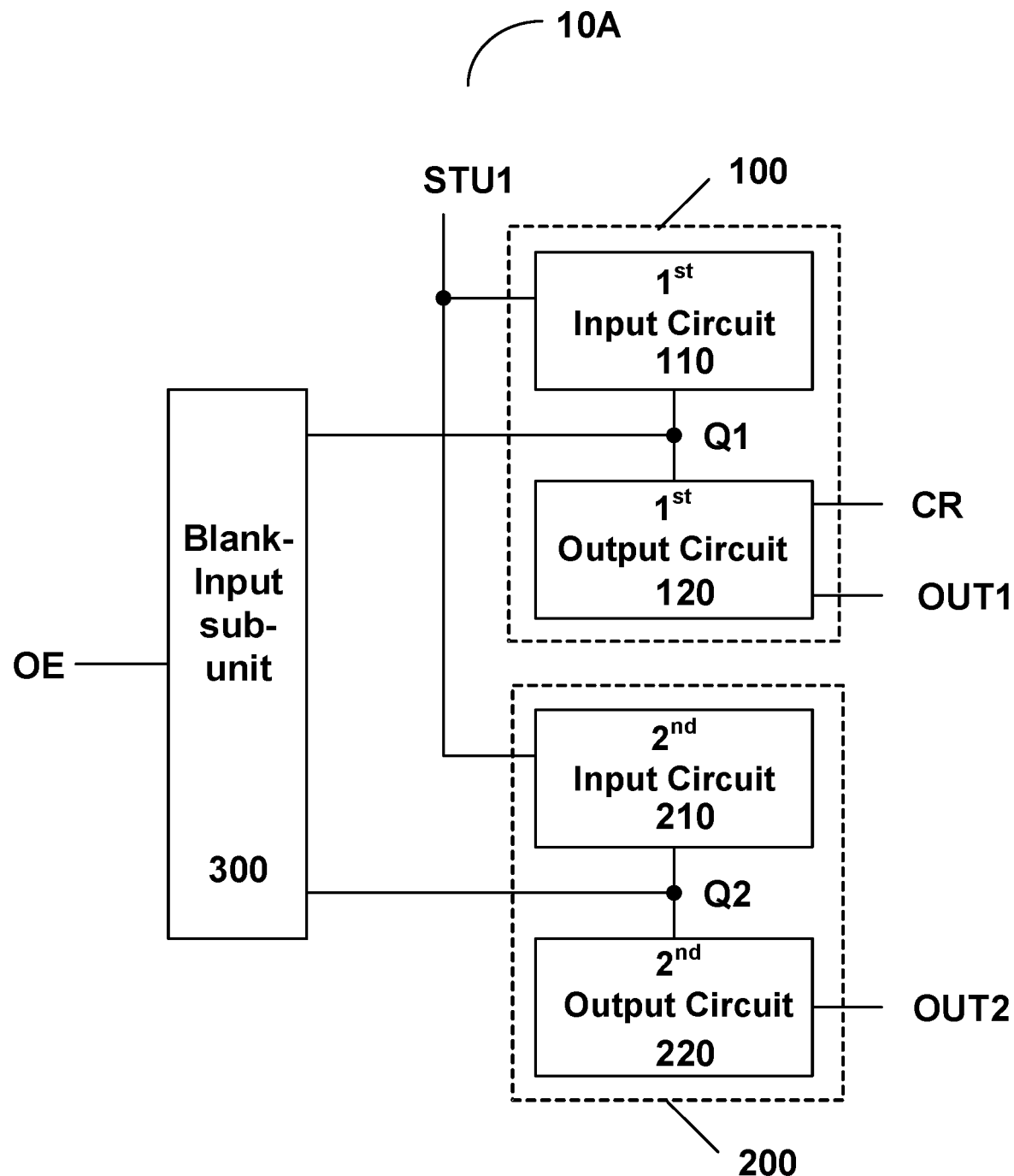
FIG. 2 is a block diagram of a shift-register unit according to another embodiment of the present disclosure.

FIG. 2 is a block diagram of a shift-register unit according to another embodiment of the present disclosure. Referring to FIG. 2, the shift-register unit 10A includes a blank-input circuit 300 respectively coupled to the first circuit 100 via the first node Q1 and coupled to the second circuit 200 via the second node Q2 and configured to receive a select-control signal OE. The blank-input circuit 300 is configured to control the voltage levels of the first node Q1 and the second node Q2 in response to the select-control signal OE. For example, the blank-input circuit 300 is configured to charge respectively the first node Q1 and the second node Q2.

Optionally, in a display period of one frame, the blank-input circuit 300 can charge the first node Q1 and also can charge the second node Q2. The first output circuit 120 then can output a first output signal OUT1 in response to the voltage level charged to the first node Q1, or the second output circuit 220 then can output a second output signal OUT2 in response to the voltage level charged to the second node Q2. The first output signal OUT1 or the second output signal OUT2 can be used to drive sensing transistors in one row of subpixel units of a display panel to complete an external compensation to the one row of subpixel units. The first output signal OUT1 and the second output signal OUT2 are different from each other.

Figure 3:
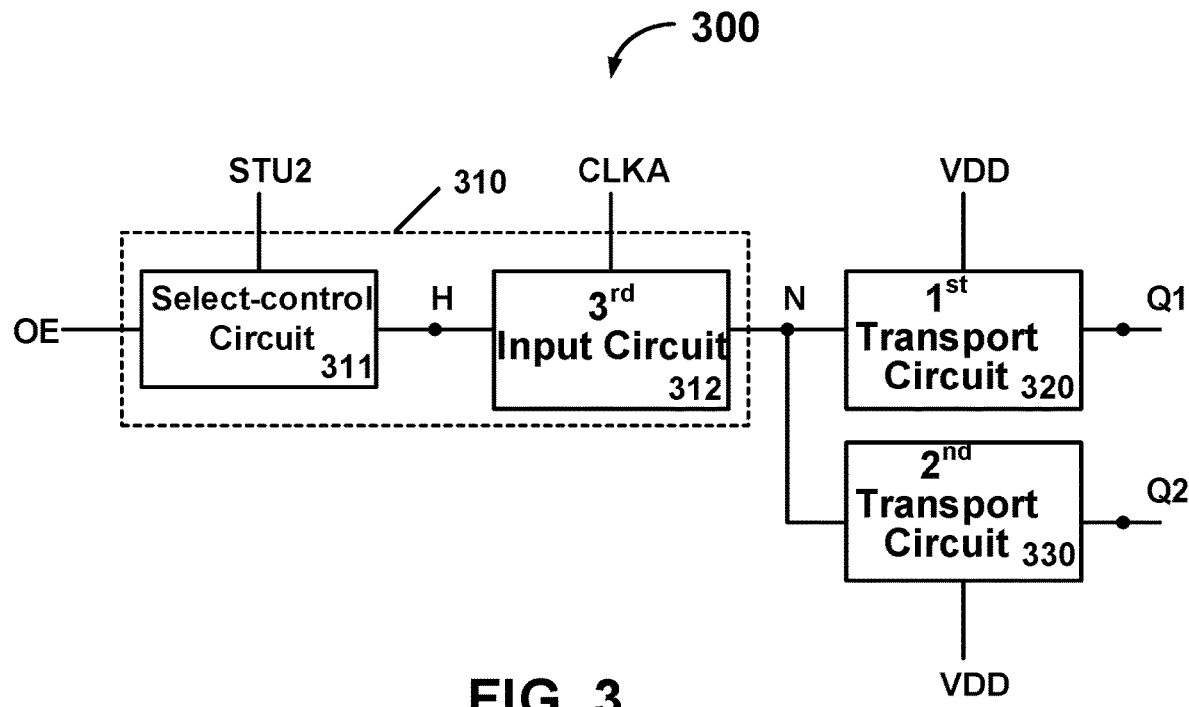
FIG. 3 is a block diagram of a blank-input circuit of the shift-register unit according to an embodiment of the present disclosure.

FIG. 3 is a block diagram of a blank-input circuit of the shift-register unit according to an embodiment of the present disclosure. In an embodiment, referring to FIG. 3, the blank-input circuit 300 includes a common-input circuit 310 coupled to a first transport circuit 320 and a second transport circuit 330 via a fourth node N. The common-input circuit 310 further includes a select-control circuit 311 coupled via a third node H to a third input circuit 312. The common-input circuit 310 is configured to control a voltage level of the third node H in response to the select-control signal OE and further to control a voltage level of the fourth node N. The select-control circuit 311 is configured to use a second input signal STU2 to charge the third node H in response to the select-control signal OE and to maintain the voltage level at the third node H. For example in a display period of a frame, the select-control circuit 311 is turned on by the select-control signal OE so that the second input signal STU2 can be used to charge the third node H. The voltage level (e.g., a high voltage level) at the third node H can be maintained throughout the display period until a blank period following the display period of the same frame.

When multiple shift-register units 10A cascaded in a multi-stage series to form a gate-driving circuit, one-stage of shift-register unit 10A can receive a shift-register signal CR outputted from other stages of shift-register units 10A as the second input signal STU2. For example, when one stage of shift-register unit 10A is selected to output a driving signal in a blank period of one frame, it is preferred to provide both the select-control signal OE and the second input signal STU2 with a same timing-waveform to the stage of shift-register unit 10A so that the select-control circuit 311 in the stage of shift-register unit 10A can be turned on and to perform corresponding charging operation described above.

Additionally, the third input circuit 312 is configured to control a voltage level at the fourth node N in response to the voltage level charged to the third node H. Optionally, the third input circuit 312 is configured to receive a first clock signal CLKA. As the third input circuit 312 is in conduction state controlled by the voltage level at the third node H, the first clock signal CLKA can be passed to the fourth node N to control the voltage level of the fourth node N. For example, in a blank period of one frame, when the first clock signal CLKA is provided with a high voltage level, the third input circuit 312 can pass the high voltage level to the fourth node N to make the fourth node N to a high voltage level.

Referring to FIG. 3, the first transport circuit 320 is connected to the first node Q1 and the fourth node N and is configured to control a voltage level at the first node Q1 in response to the voltage level of the fourth node N or a first transport signal TS1 (not shown) received by the first transport circuit 320. In some embodiments, the first transport circuit 320 can receive the first voltage VDD at a high voltage level. When the first transport circuit 320 is turned to a conduction state by the voltage level at the fourth node N, the high voltage level of the first voltage VDD can be used to charge the first node Q1. Optionally, the voltage level at the first node Q1 is charged to the level of the first voltage VDD at least within 10% of error. In some other embodiments, the first transport circuit 320 can be turned to the conduction state by the first transport signal TS1 (not shown) to establish an electrical connection between the fourth node N and the first node Q1 so that the third input circuit 312 can charge the first node Q1.

Furthermore, the second transport circuit 330 is connected to the second node Q2 and the fourth node N and is configured to control the voltage level at the second node Q2 in response to the voltage level at the fourth node N or a second transport signal TS2 (not shown) received by the second transport circuit 330. In some embodiments, the second transport circuit 330 can receive a high voltage level first voltage VDD. When the second transport circuit 330 is turned to a conduction state by the voltage level at the fourth node N, the high voltage level first voltage VDD can be used to charge the second node Q2. Optionally, the voltage level at the second node Q2 is charged to the level of the first voltage VDD at least within 10% of error. In some other embodiments, the second transport circuit 330 can also be turned to conduction state by the second transport signal TS2 (not shown) to establish an electrical connection between the fourth node N and the second node Q2 so that the third input circuit 312 can charge the second node Q2.

Optionally, the first transport signal TS1 and the second transport signal TS2 can be the same signal, e.g., a first clock signal CLKA or a first voltage VDD. Thus, the number of clock signal lines can be reduced. Optionally, the first transport signal TS1 and the second transport signal TS2 can be provided with different signals for respectively controlling the first transport circuit 320 and the second transport circuit 330. For example, when there is no need to charge the second node Q2, the second transport circuit 330 can be turned off to reduce power consumption.

Optionally, when the shift-register unit 10A includes three, or four, or more circuits, there are needs to set three, or four, or more transport circuits to perform function of the blank-input circuit 300. The three, or four, or more circuits in the shift-register unit 10A can share one blank-input circuit 300 to reduce area of the shift-register unit 10A so as to reduce the border frame size of a display apparatus that adopts the shift-register unit 10A and to enhance PPI of the display apparatus. Optionally, the blank-input circuit 300 set in the shift-register unit 10A is to allow the shift-register unit to output a driving signal during a blank period of one frame. The "blank" is merely related to the blank period of a frame. The blank-input circuit 300 is not restricted to work in the blank period only.

Figure 4:
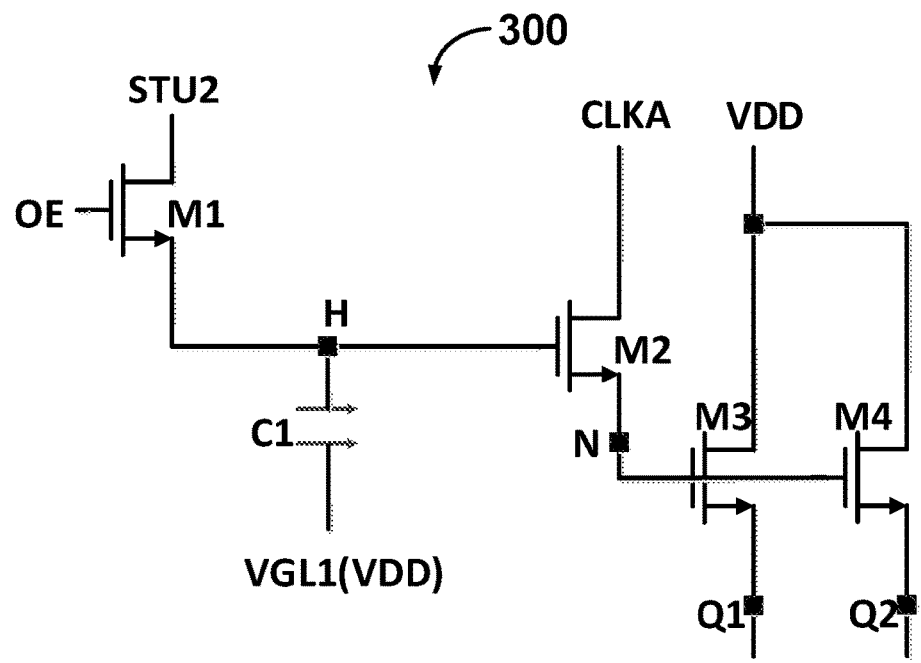
FIG. 4 is a circuit diagram of a blank-input circuit according to an embodiment of the present disclosure.

FIG. 4 is a circuit diagram of a blank-input circuit according to an embodiment of the present disclosure. FIG. 5A through FIG. 5F is a circuit diagram of a blank-input circuit according to an embodiment of the present disclosure. In some embodiments, the select-control circuit 311 can be realized by including a first transistor M1 and a first capacitor C1. The first transistor M1 has a gate terminal configured to receive the select-control signal OE. The first transistor M1 has a first terminal configured to receive a second input signal STU2. The first transistor M1 has a second terminal coupled to the third node H. For example, when the select-control signal OE is provided as a high voltage turn-on signal, the first transistor M1 is turned on so that the second input signal STU2 is used to charge the third node H.

The first capacitor C1 has a first terminal coupled to the third node H and a second terminal configured to receive a fourth voltage VGL1 or a first voltage VDD. By setting the first capacitor C1, the voltage level at the third node H can be maintained. For example, in a display period of a frame, the select-control circuit 311 can charge the third node H to pull up the voltage level of the third node H to a high voltage level. The first capacitor C1 can maintain the high voltage level at the third node H until a blank period of the frame. In some other embodiments, the first capacitor C1 has a second terminal coupled to the fourth node N. Optionally, the fourth voltage VGL1 is a low voltage level or a turn-off signal.

Referring to FIG. 4, the third input circuit 312 is achieved by including a second transistor M2. The second transistor M2 has a gate terminal coupled to the third node H, a first terminal configured to receive a first clock signal CLKA, and a second terminal coupled to the fourth node N. When the third node H is set to a high voltage level, the second transistor M2 is turned on so that the first clock signal CLKA can be passed to the fourth node N to pull up the voltage level there to a high voltage level.

Referring to FIG. 4, the first transport circuit 320 includes a third transistor M3 and the second transport circuit 330 includes a fourth transistor M4. The third transistor M3 has a gate terminal coupled to the fourth node N, a first terminal configured to receive the first voltage VDD, and a second terminal coupled to the first node Q1. For example, when the fourth node N is set to a high voltage level, the third transistor M3 is turned on so that the first voltage VDD can be used to charge the first node Q1. Optionally, the voltage level at the first node Q1 is charged to the level of the first voltage VDD at least within 10% of error. The fourth transistor M4 has a gate terminal coupled to the fourth node N, a first terminal configured to receive the first voltage VDD, and a second terminal coupled to the second node Q2. For example, when the fourth node N is set to a high voltage level, the fourth transistor M4 is turned on so that the first voltage VDD can be used to charge the second node Q2.

Figure 5A:
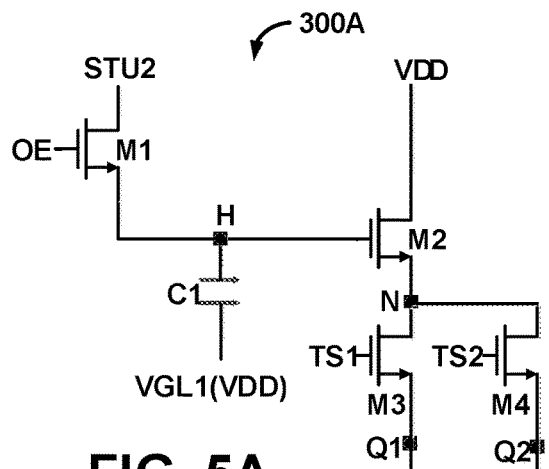
FIG. 5A through FIG. 5F is a circuit diagram of a blank-input circuit according to an embodiment of the present disclosure.

Referring to FIG. 5A, in a specific embodiment, the blank-input circuit 300A includes a second transistor M2 having a first terminal configured to receive the first voltage VDD, a third transistor M3 having a gate terminal configured to receive the first transport signal TS1, and a fourth transistor M4 having a gate terminal configured to receive the second transport signal TS2. The third transistor M3 also has a first terminal coupled to the fourth node N and the fourth transistor M4 also has a first terminal coupled to the fourth node N. In a display period of a frame, when it needs to charge the first node Q1, it is an option to provide a high voltage to the first transport signal TS1 to make the third transistor M3 to be turned on. Thus, the high voltage level of the first voltage VDD can pass through the second transistor M2, the fourth node N, and the third transistor M3 to charge the first node Q1. In a blank period of a frame, when it needs to charge the second node Q2, it is an option to provide a high voltage to the second transport signal TS2 to make the fourth transistor M4 in conduction state, so that the high voltage level of the first voltage VDD can be passed through the second transistor M2, the fourth node N, and the fourth transistor M4 to charge the second node Q2.

Figure 5B:
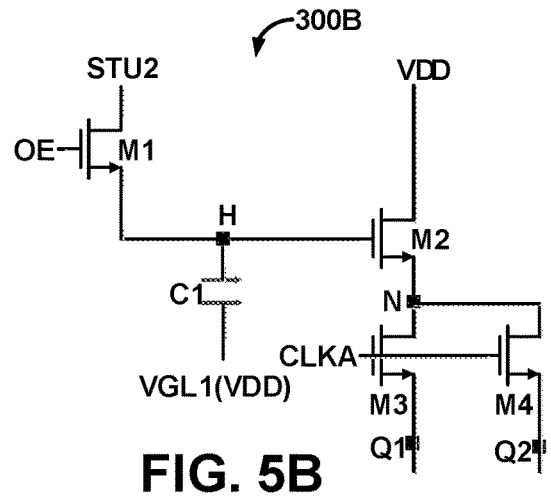

Referring to FIG. 5B, in another specific embodiment, the blank-input circuit 300B includes a third transistor M3 and a fourth transistor M4. The third transistor M3 as well as the fourth transistor M4 are configured to have their gate terminals respectively receiving a first clock signal CLKA. In other words, TS1=TS2=CLKA. For example, in a blank period of a frame, when the first clock signal CLKA is provided with a high voltage level, the third transistor M3 and the fourth transistor M4 are turned on at the same time, the high voltage level of the first voltage VDD can charge the first node Q1 and the second node Q2 at the same time. Optionally, the voltage level of the first node Q1 is the same as the voltage level of the second node Q2.

Figure 5C:
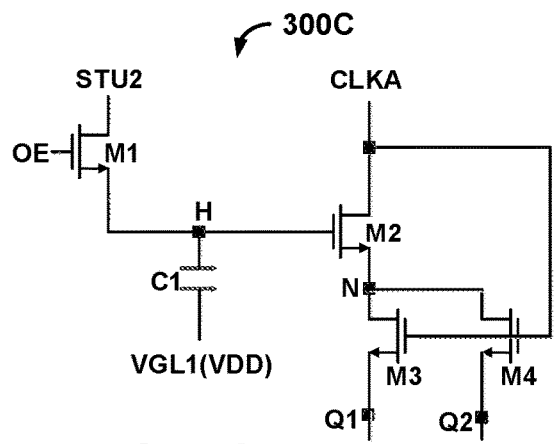

Referring to FIG. 5C, in yet another specific embodiment, the blank-input circuit 300C includes a second transistor M2 having a first terminal configured to receive the first clock signal CLKA. The third transistor M3 as well as the fourth transistor M4 are configured to have their gate terminals respectively connected to the first terminal of the second transistor M2 to receive the first clock signal CLKA. Thus, the first terminal of the second transistor M2 in FIG. 5C can be set to a high voltage level with a less time compared to the second transistor M2 in FIG. 5B whose first terminal is always coupled to the first voltage VDD at the high voltage level. Thus, the second transistor M2 in FIG. 5C may have longer work life to ensure stability of the shift-register unit.

Figure 5D:
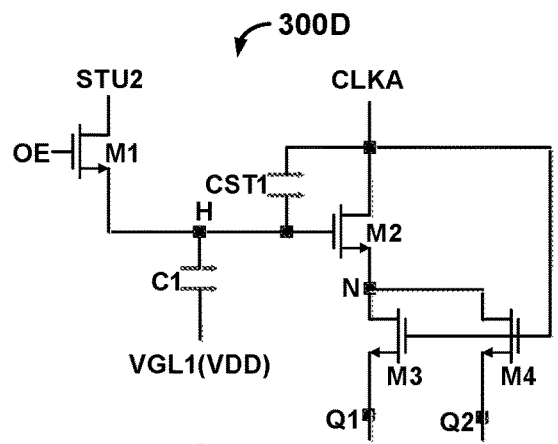

Referring to FIG. 5D, in still another specific embodiment, the blank-input circuit 300D further includes a first coupling capacitor CST1 in addition to the circuit shown in FIG. 5C. The coupling capacitor CST1 has a first terminal configured to receive the first clock signal CLKA and a second terminal coupled to the third node H. When the first clock signal CLKA is changed from a low voltage level to a high voltage level, the first clock signal CLKA can pull up a voltage level at the third node H through a coupling effect of the first coupling capacitor CST1 to push the voltage level of the third node H even higher, ensuring that the second transistor M2 is sufficiently turned on.

Figure 5E:
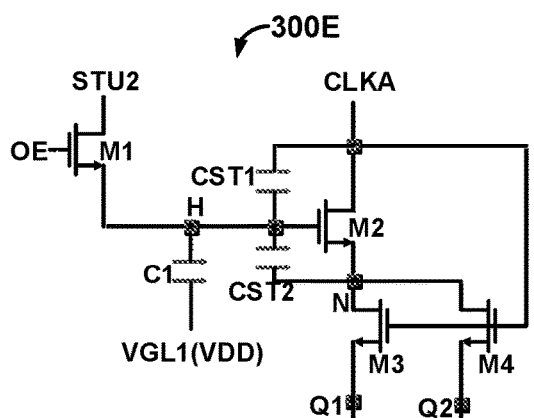

Referring to FIG. 5E, in yet still another specific embodiment, the blank-input circuit 300E further includes a second coupling capacitor CST2 in addition to the circuit shown in FIG. 5D. The second coupling capacitor CST2 has a first terminal coupled to the third node H and a second terminal coupled to the fourth node N. When the first clock signal CLKA is changed from a low voltage level to a high voltage level, if the second transistor M2 is turned on, the high voltage level of the first clock signal CLKA can be passed through the second transistor M2 to the fourth node N. The voltage level at the second terminal of the second coupling capacitor CST2 will be pulled up. By a bootstrap effect of the coupling capacitor, the voltage level at the third node H can be further pushed higher to ensure the second transistor M2 be sufficiently turned on.

Figure 5F:
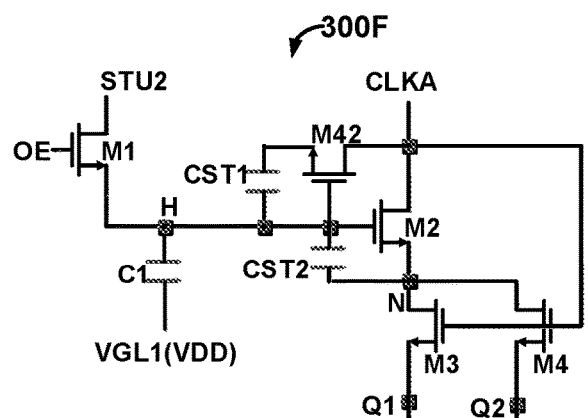

Referring to FIG. 5F, in also another specific embodiment, the blank-input circuit 300F further includes a forty-second transistor M42 in addition to the circuit shown in FIG. 5E. The forty-second transistor M42 has a gate terminal coupled to the third node H, a first terminal configured to receive the first clock signal CLKA, and a second terminal coupled to the first terminal of the first coupling capacitor CST1. When the third node H is set to a high voltage level, the forty-second transistor M42 is turned on. Then, the first clock signal CLKA is able to pull up the third node H via a coupling effect of the first coupling capacitor CST1 so that the third node H is pushed to an even higher voltage level, ensuring that the second transistor M2 is sufficiently turned on.

Figure 6:
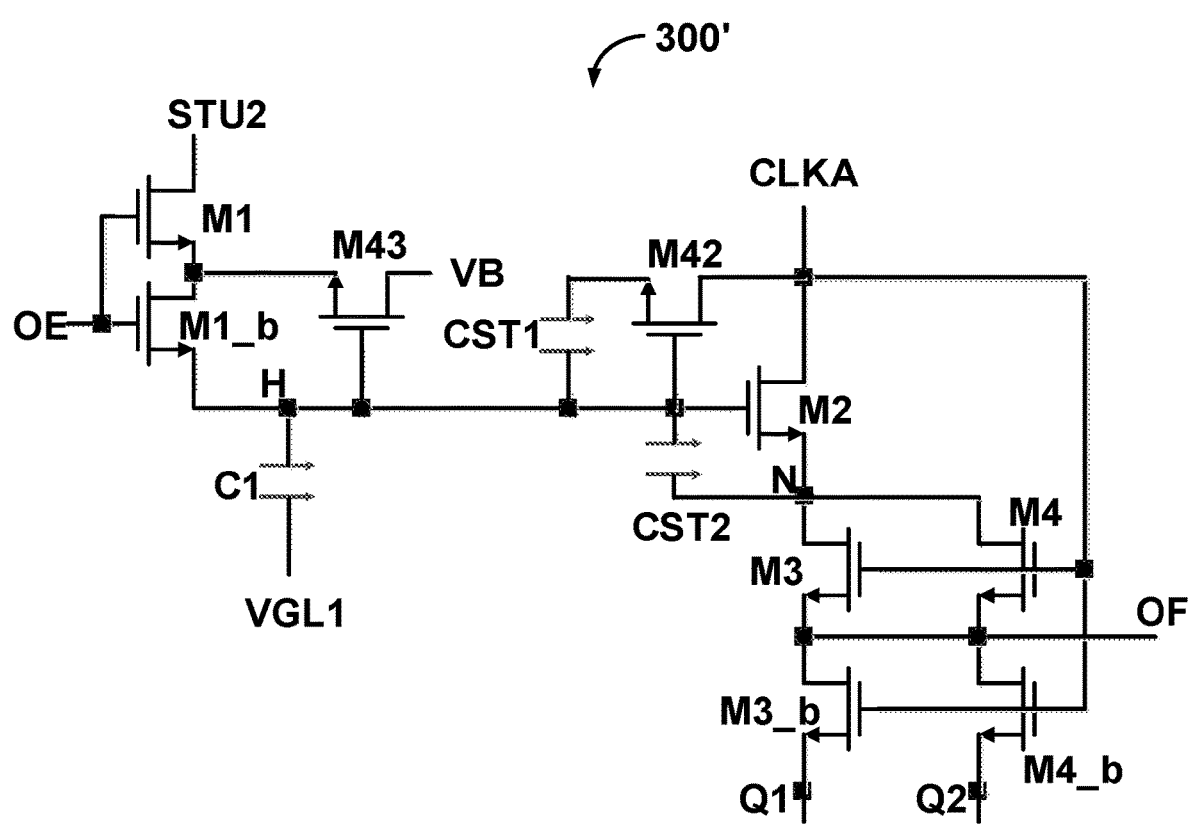
FIG. 6 is a circuit diagram of a blank-input circuit including an anti-leak structure according to an embodiment of the present disclosure.

FIG. 6 is a circuit diagram of a blank-input circuit including an anti-leak structure according to an embodiment of the present disclosure. Referring to FIG. 6, in an alternative embodiment, the blank-input circuit 300' further includes a forty-third transistor M43 and transistors M1_b, M3_b, and M4_b in addition to the circuit shown in FIG. 5E. The forty-third transistor M43 has a gate terminal coupled to the third node H, a first terminal configured to receive a sixth voltage VB, and a second terminal coupled to the second terminal of the first transistor M1. Transistor M1_b has a gate terminal configured to receive the select-control signal OE, a first terminal coupled to the second terminal of the first transistor M1, and a second terminal coupled to the third node H. Transistor M3_b and transistor M4_b have their gate terminals commonly configured to receive the first clock signal CLKA. Transistor M3_b and transistor M4_b have their first terminals commonly coupled to a seventh node OF. Transistor M3_b also has a second terminal coupled to the first node Q1 and transistor M4_b also has a second terminal coupled to the second node Q2.

The forty-third transistor M43 and transistor M1_b are combined to provide an anti-leak function to prevent current leaking at the third node H. Transistor M3_b is also able to prevent current leaking at the first node Q1. Transistor M4_b is also able to prevent current leaking at the second node Q2. Optionally, the sixth voltage VB is set to a high voltage level. Optionally, more details about the anti-leak function achieved in the blank-input circuit and its relevance with the seventh node OF will be described in the specification below. Optionally, the transistors employed in the blank-input circuits shown in FIG. 4, FIG. 5A through FIG. 5F, and FIG. 6 are all N-type transistors as an example.

Figure 7:
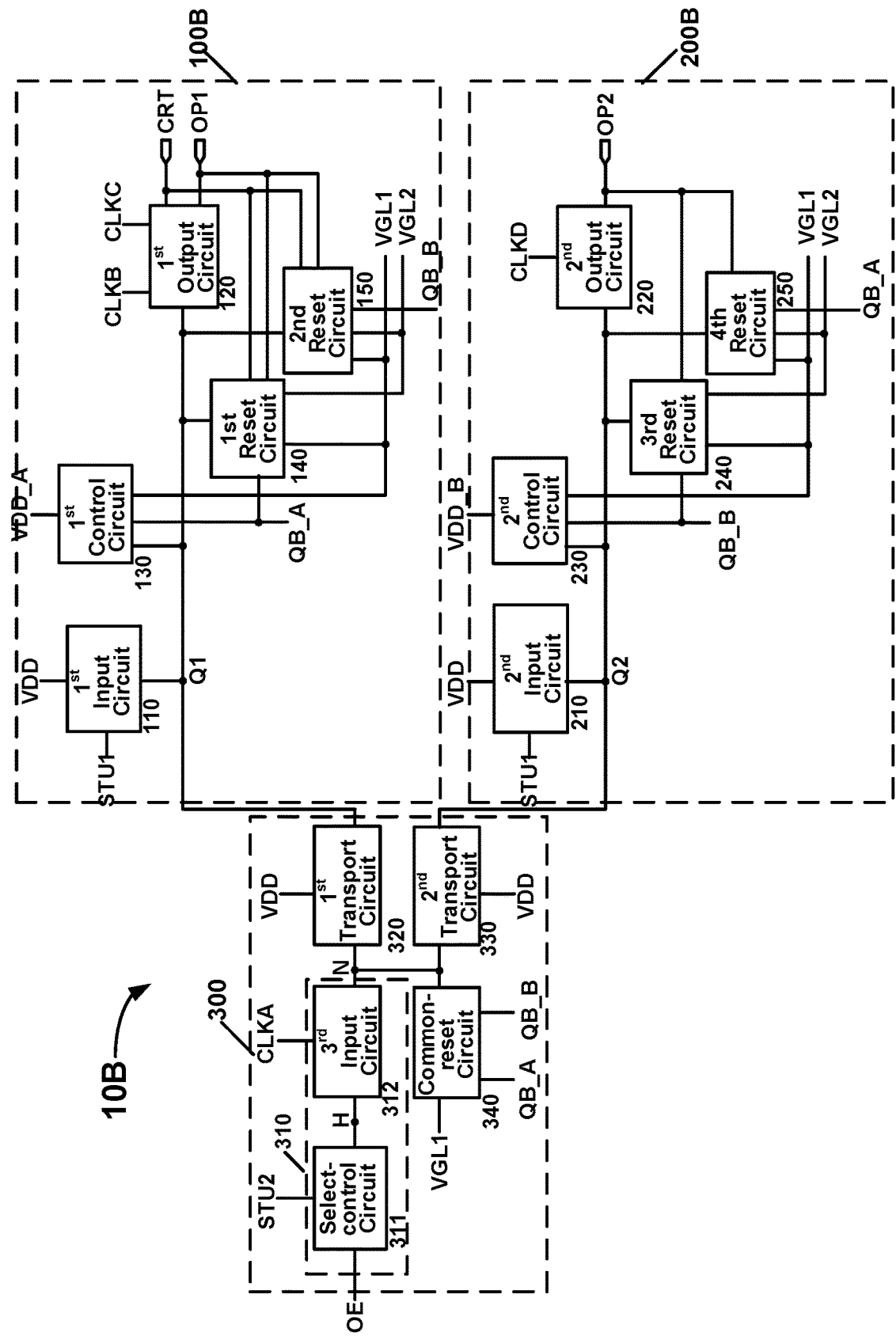
FIG. 7 is a block diagram of a shift-register unit according to yet another embodiment of the present disclosure.

FIG. 7 is a block diagram of a shift-register unit according to yet another embodiment of the present disclosure. Referring to FIG. 7, the shift-register unit 10B includes, in addition to the circuit shown in FIG. 2, a first control circuit 130, a first reset circuit 140, a second reset circuit 150, a shift-register output terminal CRT, and a first output terminal OP1. The shift-register output terminal CRT is provided to output the shift-register signal CR. The first output terminal OP1 is provided to output the first output signal OUT1.

The first control circuit 1130 is configured to control a voltage level of a fifth node QB_A in response to the voltage level at the first node Q1 and a second voltage VDD_A. For example, the first control circuit 130 is connected to the first node Q1 and the fifth node QB_A and is configured to receive the second voltage VDD_A and the fourth voltage VGL1. When the first node Q1 is set to a high voltage level (with a 10% error being allowed), the first control circuit 130 can use the fourth voltage VGL1 at a low voltage level to pull down the voltage level of the fifth node QB_A to a low voltage level. Optionally, when the first node Q1 is set to a low voltage level (with a 10% error being allowed), the first control circuit 130 can use the second voltage VDD_A at a high voltage level to charge the fifth node QB_A so as to pull up the voltage level of the fifth node QB_A to a high voltage level.

The first reset circuit 140 is configured to reset voltage levels at the first node Q1, the shift-register output terminal CRT, and the first output terminal OP1 in response to the voltage level at the fifth node QB_A. The first reset circuit 140 is connected respectively to the first node Q1, the fifth node QB_A, the shift-register output terminal CRT, and the first output terminal OP1, and is configured to receive the fourth voltage VGL1 and a fifth voltage VGL2. When the first reset circuit 140 is turned on by the voltage level at the fifth node QB_A, it can use the fourth voltage VGL1 (at a low voltage level) to pull down or reset the voltage levels of the first node Q1 and the shift-register output terminal CRT to a low voltage level. At the same time, it also can use the fifth voltage VGL2 (also at a low voltage level) to pull down or reset the voltage level of the first output terminal OP1 to a low voltage level. Optionally, the first reset circuit 140 can also use the fourth voltage VGL1 to pull down or reset the voltage level of the first output terminal OP1 to a low voltage level.

The second reset circuit 150 is configured to reset voltage levels of the first node Q1, the shift-register output terminal CRT, and the first output terminal in response to a voltage level at the sixth node QB_B. Referring to FIG. 7, the second reset circuit 150 is connected respectively to the first node Q1, the sixth node QB_B, the shift-register output terminal CRT, and the first output terminal OP1, and is configured to receive the fourth voltage VGL1 and the fifth voltage VGL2. When the second reset circuit 150 is turned on by the voltage level at the sixth node QB_B, it is an option that the fourth voltage VGL1 (at the low voltage level) is used to pull down or reset the voltage level at the first node Q1 and the shift-register output terminal CRT to a low voltage level. At the same time, it is an option to use the fifth voltage VGL2 (at the low voltage level) to pull down or reset the voltage level of the first output terminal OP1 to a low voltage level.

Referring to FIG. 7, the second circuit 200B also includes a second control circuit 230, a third reset circuit 240, a fourth reset circuit 250, and a second output terminal OP2. The second output terminal OP2 is to output the second output signal OUT2.

The second control circuit 230 is configured to control a voltage level of the sixth node QB-B in response to a voltage level at the second node Q2 and a third voltage VDD_B. Referring to FIG. 7, the second control circuit 230 is connected to the second node Q2 and the sixth node QB_B, and is configured to receive the third voltage VDD_B and the fourth voltage VGL1. When the second node Q2 is set to a high voltage level, the second control circuit 230 can use the fourth voltage VGL1 at the low voltage level to pull down the voltage level of the sixth node QB_B to a low voltage level. When the second node Q2 is set to a low voltage level, the second control circuit 230 also can use the third voltage VDD_B (at a high voltage level) to charge the sixth node QB_B so as to pull up the voltage level thereof.

The third reset circuit 240 is configured to reset the second node Q2 and the second output terminal OP2 to a low voltage level in response to the voltage level at the sixth node QB_B. For example, the third reset circuit 240 is connected to the second node Q2, the sixth node QB_B, and the second output terminal OP2, and is configured to receive the fourth voltage VGL1 and the fifth voltage VGL2. When the third reset circuit 240 is turned on by the voltage level at the sixth node QB_B, it is an option to use the fourth voltage VGL1 to pull down the voltage level at the second node Q2 to a low voltage level. At the same time, it is also an option to use the fifth voltage VGL2 to pull down the voltage level at the second output terminal OP2. Optionally, the fourth voltage VGL1 can also be used to pull down or reset the second output terminal OP2 to a low voltage level.

The fourth reset circuit 250 is configured to reset the second node Q2 and the second output terminal OP2 in response to the voltage level at the fifth node QB_A. For example, the fourth reset circuit 250 is connected to the second node Q2, the fifth node QB_A, and the second output terminal OP2, and is configured to receive the fourth voltage VGL1 and the fifth voltage VGL2. When the fourth reset circuit 250 is turned on by the voltage level at the fifth node QB_A, it is an option to use the fourth voltage VGL1 (at the low voltage level) to pull down or reset the second node Q2 to the low voltage level. At the same time, it is also an option to use the fifth voltage VGL2 (at the low voltage level) to pull down or reset the second output terminal OP2 to low voltage level.

Optionally, the second voltage VDD_A and the third voltage VDD_B can be set to two out-of-phase voltage signals, i.e., when the second voltage VDD_A is given a high voltage level, the third voltage VDD_B is given a low voltage level, while the second voltage VDD_A is a low voltage level, the third voltage VDD_B is a high voltage level. By setting in this way, the first control circuit 130 and the second control circuit 230 can have one circuit be in working mode at one time. This can avoid functional drift of the circuits due to long-time working and enhance the circuit stability.

Referring to FIG. 7, the blank-input circuit 300 of the shift-register unit 10B also includes a common-reset circuit 340. The common-reset circuit 340 is connected respectively to the fourth node N, the fifth node QB_A, and the sixth node QB_B, and is configured to reset the voltage level of the fourth node N in response to the voltage level at the fifth node QB_A or the sixth node QB_B. For example, the common-reset circuit 340 can be configured to receive the fourth voltage VGL1. When the common-reset circuit 340 is turned on by the voltage level of the fifth node QB_A or the sixth node QB_B, it can use the fourth voltage VGL1 to pull down or reset the fourth node N to a low voltage level. By setting up the common-reset circuit 340 in the blank-input circuit, it is able to better control the voltage level at the fourth node N. When there is no need to charge the first node Q1 or the second node Q2, the fourth node N can be set to a low voltage level to turn off the first transport circuit 320 and the second transport circuit 330. Thus, the high voltage level from the first voltage VDD is prevented from charging the first node Q1 and the second node Q2. In this way, abnormal signal output can be avoided, enhancing the circuit stability.

Figure 8:
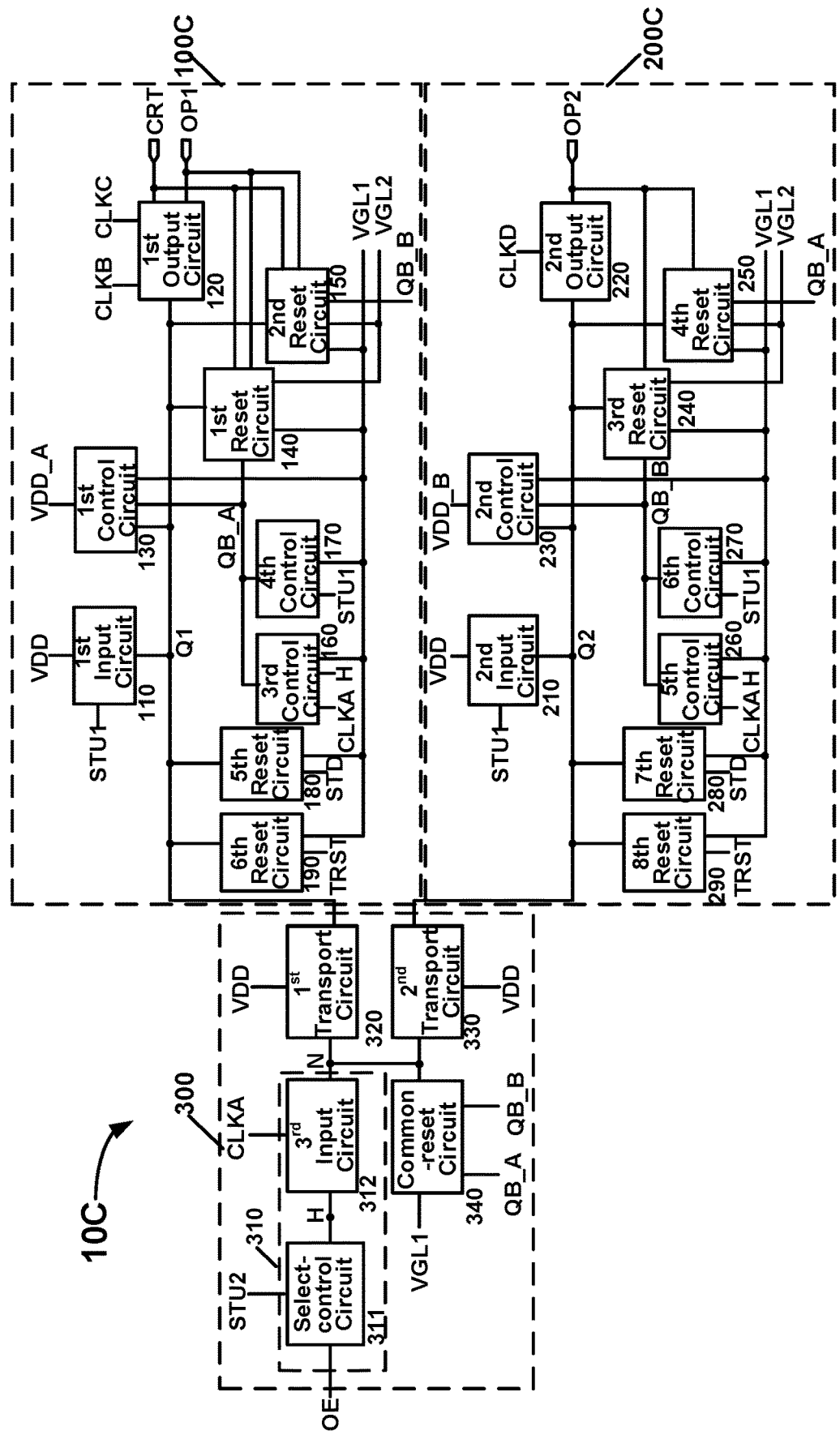
FIG. 8 is a block diagram of a shift-register unit according to still another embodiment of the present disclosure.

FIG. 8 is a block diagram of a shift-register unit according to still another embodiment of the present disclosure. Referring to FIG. 8, the shift-register unit 10C, in additional to the circuit shown in FIG. 7, is provided with its first circuit 100 further including a third control circuit 160 and a fourth control circuit 170. The third control circuit 160 is configured to control a voltage level of the fifth node QB_A in response to the first clock signal CLKA. The fourth control circuit 170 is configured to control a voltage level of the fifth node QB_A in response to the first input signal STU1.

In an embodiment, the third control circuit 160 is connected to the fifth node QB_A and is configured to receive the first clock signal CLKA and the fourth voltage VGL1. For example, in a display period of a frame, the third control circuit 160 can be turned on in response to the first clock signal CLKA so as to use the fourth voltage VGL1 to pull down the fifth node QB_A to a low voltage level. In another embodiment, the third control circuit 160 is also connected to the third node H. In a blank period of a frame, when the third node H is set to a high voltage level and the first clock signal CLKA is provided with a high voltage level, the third control circuit 160 is turned on so that the fourth voltage VGL1 at the low voltage level can be used to pull down the fifth node QB_A to a low voltage level.

The fourth control circuit 170 is connected to the fifth node QB_A and is configured to receive the first input signal STU1 and the fourth voltage VGL1. For example, in a display period of a frame, the fourth control circuit 170 is turned on in response to the first input signal STU1 and the fourth voltage VGL1 can be used to pull down the fifth node QB_A to a low voltage level. Once the fifth node QB_A is pull down to the low voltage level, it can avoid its affection to the first node Q1 so that the charging to the first node Q1 during the display period is more sufficient.

Referring to FIG. 8, the second circuit 200, in addition to the circuit shown in FIG. 7, also includes a fifth control circuit 260 and a sixth control circuit 270. The fifth control circuit 260 is configured to control a voltage level of the sixth node QB_B in response to the first clock signal CLKA. The sixth control circuit 270 is configured to control a voltage level of the sixth node QB_B in response to the first input signal STU1.

In an embodiment, the fifth control circuit 260 is connected to the sixth node QB_B and is configured to receive the first clock signal CLKA and the fifth voltage VGL1. For example, in a blank period of a frame, the fifth control circuit 260 can be turned on in response to the first clock signal CLKA. Thus, the fourth voltage VLG1 at the low voltage level can be used to pull down voltage level at the sixth node QB_B. In another embodiment, the fifth control circuit 260 is also connected to the third node H. For example, in the blank period of the frame, when the third node H is set to a high voltage level and the first clock signal CLKA is provided with a high voltage level, the fifth control circuit 260 is turned on, so that the fourth voltage VGL1 can be used pull down the sixth node QB_B to a low voltage level.

The sixth control circuit 270 is connected to the sixth node QB_B and is configured to receive the first input signal STU1 and the fourth voltage VGL1. For example, in a display period of a frame, the sixth control circuit 270 is turned on in response to the first input signal STU1. The low fourth voltage VGL1 can be used to pull down the sixth node QB_B. The sixth node QB_B is pulled down to a low voltage level to prevent an affection of the sixth node QB_B on the second node Q2 so that the charging of the second node Q2 during the display period is more sufficient.

Referring to FIG. 8, the first circuit 100C further includes a fifth reset circuit 180 and a sixth reset circuit 190. The fifth reset circuit 180 is configured to reset the first node Q1 in response to a display-reset signal STD. The sixth reset circuit 190 is configured to reset the first node Q1 in response to a full-scale reset signal TRST.

In an embodiment, the fifth reset circuit 180 is connected to the first node Q1 and is configured to receive a display-reset signal STD and the fourth voltage VGL1. In a display period of a frame, the fifth reset circuit 180 is turned on in response to the display-reset signal STD so that the fourth voltage VGL1 at the low voltage level can be used to pull down or reset the first node Q1. For example, when multiple shift-register units 10C are cascaded to form a multi-stage gate-driving circuit, one stage of shift-register unit 10C can receive shift-register signal CR outputted from another stage of shift-register unit as the display-reset signal STD.

In an embodiment, the sixth reset circuit 190 is connected to the first node Q1 and is configured to receive a full-scale reset signal TRST and the fourth voltage VGL1. When multiple shift-register units 10C are cascaded to form a multi-stage gate-driving circuit, in a display period of a frame, a sixth reset circuit 190 in a respective one stage of shift-register unit 10C is turned on in response to the full-scale reset signal TRST. Thus, the fourth voltage VGL1 at the low voltage level can be used to pull down or reset the first node Q1 of the respective one stage of shift-register unit 10C and so as to achieve a full-scale reset to the gate-driving circuit.

Referring to FIG. 8, the second circuit 200C also includes a seventh reset circuit 280 and an eighth reset circuit 290. The seventh reset circuit 280 is configured to reset the second node Q2 in response to a display-reset signal STD. The eighth reset circuit 290 is configured to reset the second node Q2 in response to a full-scale reset signal TRST.

In an embodiment, the seventh reset circuit 280 is connected to the second node Q2 and is configured to receive the display-reset signal STD and the fourth voltage VGL1. For example, in a display period of a frame, the seventh reset circuit 280 is turned on in response to the display-reset signal STD so that the fourth voltage VGL1 at the low voltage level can be used to pull down or reset the second node Q2.

In an embodiment, the eighth reset circuit 290 is connected to the second node Q2 and is configured to receive the full-scale reset signal TRST and the fourth voltage VGL1. For example, when multiple shift-register units 10C are cascaded to form a multi-stage gate-driving circuit, in a display period of a frame, an eighth reset circuit 290 of a respective one stage of shift-register unit can be turned on in response to the full-scale reset signal TRST. The fourth voltage VGL1 at the low voltage level thus can be used to pull down or reset the second node Q2 in the respective one stage of shift-register unit 10C to a low voltage level so that a full-scale reset of the gate-driving circuit can be achieved.

Figure 9A:
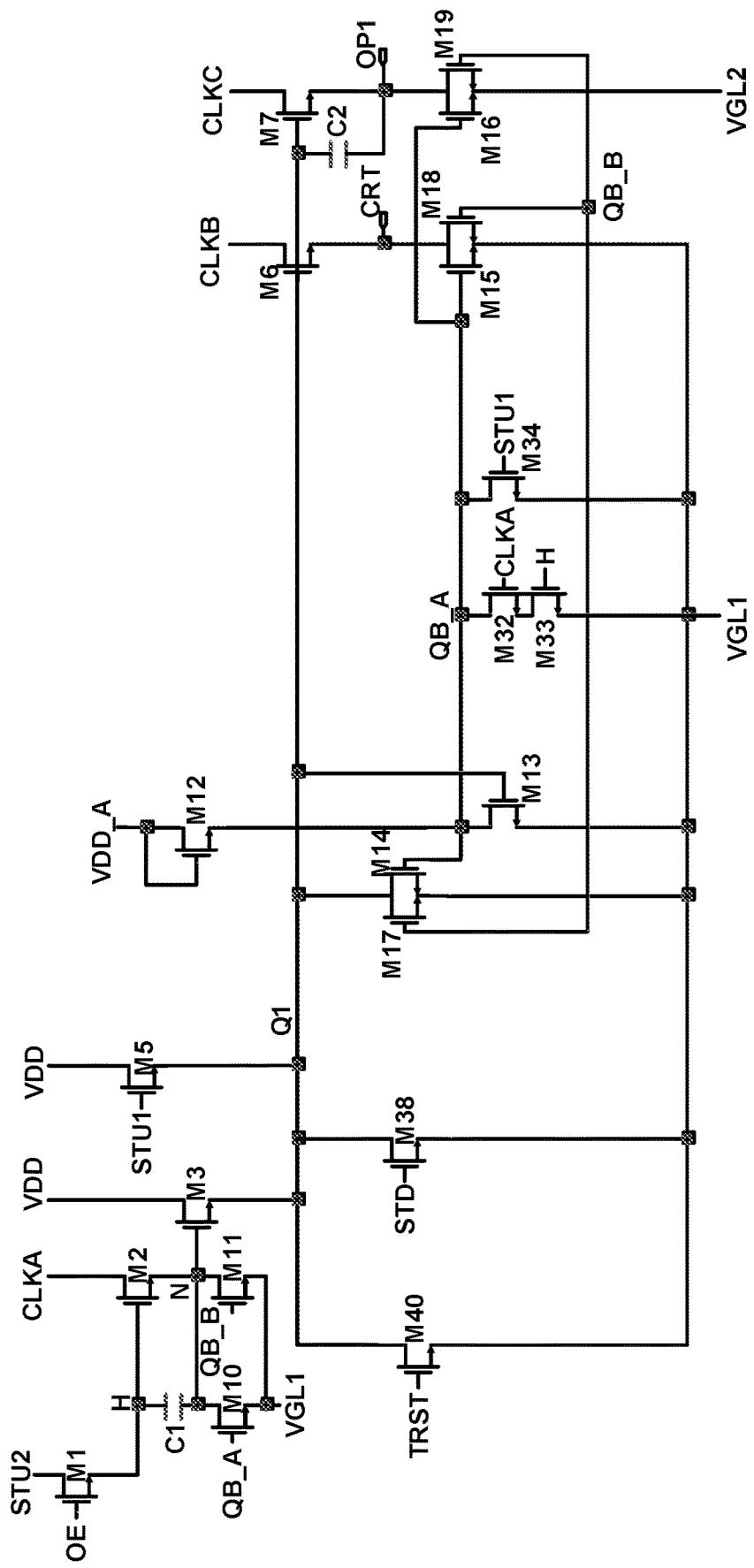
FIG. 9A and FIG. 9B are circuit diagrams of respective a first circuit and a second circuit of a shift-register unit according to an embodiment of the present disclosure.
Figure 9B:
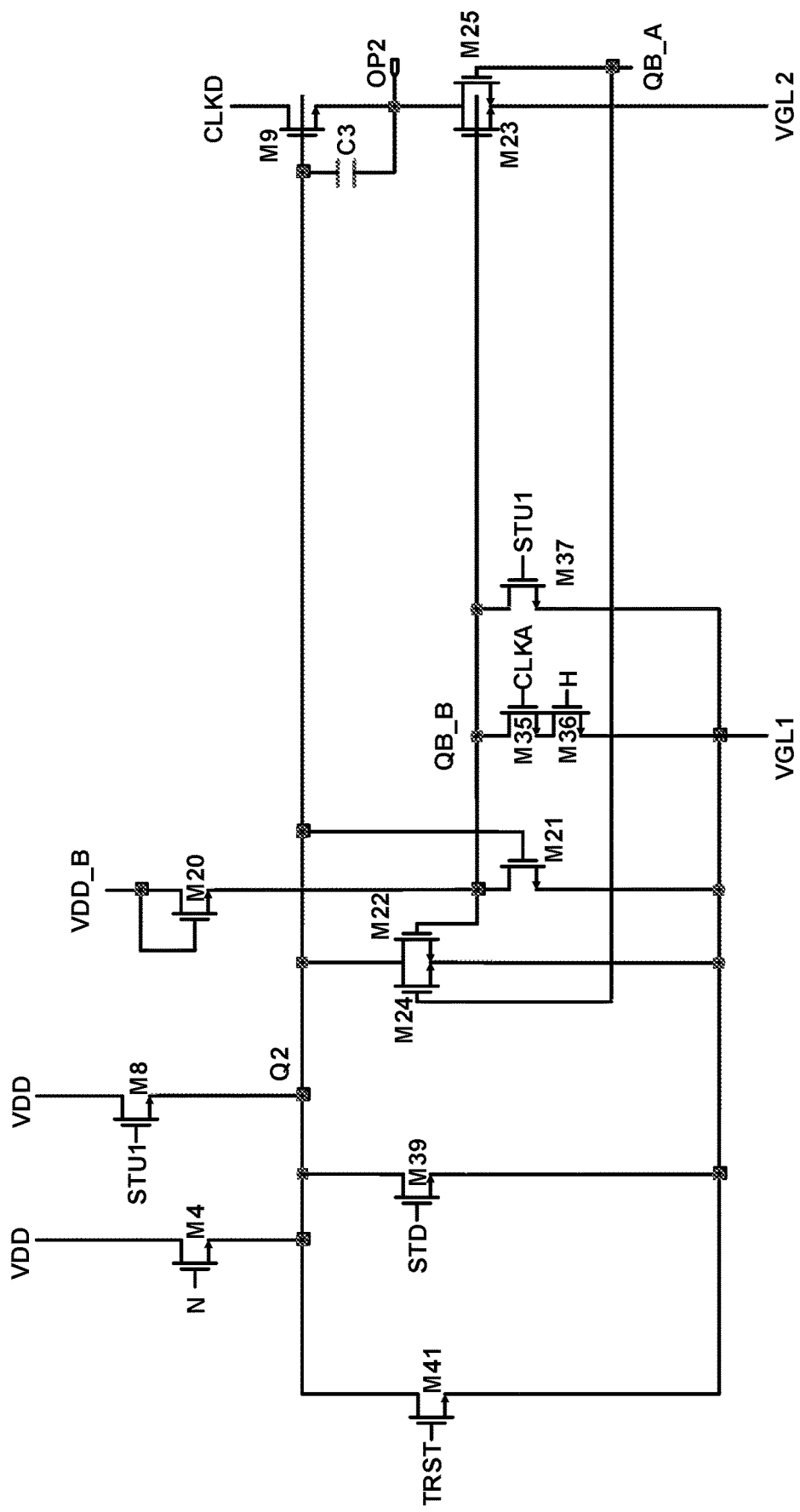
Figure 10A:
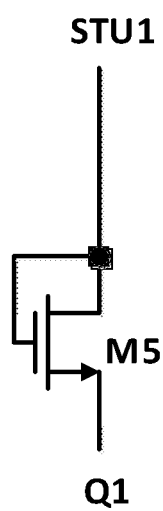
FIG. 10A through FIG. 10C are circuit diagrams of three kinds of a first input circuit of a shift-register unit according to an embodiment of the present disclosure.
Figure 10B:
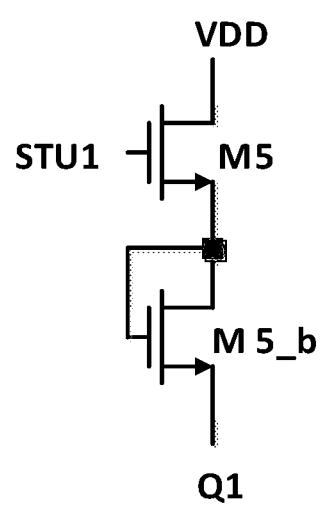
Figure 10C:
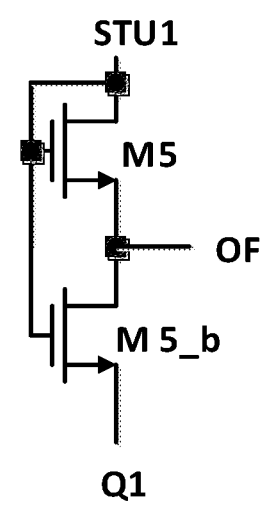

FIG. 9A and FIG. 9B are circuit diagrams of respective a first circuit and a second circuit of a shift-register unit according to an embodiment of the present disclosure. In particular, FIG. 9A shows a part of the shift-register unit including a first circuit 100 and a blank-input circuit 300. FIG. 9B shows a part of the shift-register unit including a second circuit 200 and a second transport circuit 330. Referring to FIG. 9A and FIG. 9B, the shift-register unit includes many transistors from M1 through M41, a first capacitor C1, a second capacitor C2, and a third capacitor C3. All transistors used here are N-type transistors as examples. FIG. 10A through FIG. 10C are circuit diagrams of three kinds of a first input circuit of a shift-register unit according to an embodiment of the present disclosure.

In an embodiment, referring to the FIG. 9A, the first input circuit 110 is achieved by including a fifth transistor M5. The fifth transistor M5 has a gate terminal configured to receive the first input signal STU1, a first terminal configured to receive the first voltage VDD, and a second terminal coupled to the first node Q1.

In another embodiment, referring to the FIG. 10A, the fifth transistor M5 has its gate terminal and its first terminal commonly configured to receive the first input signal STU1 so that when the first input signal STU1 is a high voltage signal, the fifth transistor M5 is able to use the high voltage of the first input signal STU1 to charge the first node Q1.

In yet another embodiment, referring to the FIG. 10B, the first input circuit 110 also includes a transistor M5_b. The transistor M5_b has a gate terminal and a first terminal commonly coupled to the second terminal of the fifth transistor M5. The transistor M5_b also has a second terminal coupled to the first node Q1. Since the transistor M5_b uses a diode connection manner, the current can only flow from the first terminal to the second terminal of the transistor M5_b but not the other way. Thus, the current leaking from the first node Q1 via the fifth transistor M5 is prevented.

In still another embodiment, referring to FIG. 10C, the transistor M5_b has a gate terminal coupled to the gate terminal of the fifth transistor M5, which are both configured to receive the first input signal STU1. The transistor M5_b has a first terminal coupled to a seventh node OF. The first input circuit 110 shown in FIG. 10C adopts an anti-leak circuitry structure to prevent current leaking of the first node Q1.

Referring to FIG. 9A again, the first output circuit 120 can be achieved by including a sixth transistor M6, a seventh transistor M7, and a second capacitor C2. The sixth transistor M6 has a gate terminal coupled to the first node Q1. The sixth transistor M6 has a first terminal configured to receive a second clock signal CLKB as a shift-register signal CR. The sixth transistor M6 has a second terminal coupled to the shift-register output terminal CRT and configured to output the shift-register signal CR.

The seventh transistor M7 has a gate terminal coupled to the first node Q1. The seventh transistor M7 has a first terminal configured to receive a third clock signal CLKC as a first output signal OUT1. The seventh transistor M7 has a second terminal coupled to the first output terminal OP1 and configured to output the first output signal OUT1. The second capacitor C2 has a first terminal coupled to the first node Q1 and a second terminal coupled to the second terminal of the seventh transistor M7 which is also the first output terminal OP1.

Referring to FIG. 9B again, the second input circuit 210 can be achieved by including an eighth transistor M8. The eighth transistor M8 has a gate terminal configured to receive the first input signal STU1. The eighth transistor M8 has a first terminal configured to receive the first voltage VDD. The eighth transistor M8 has a second terminal coupled to the second node Q2. Alternatively, the second input circuit 210 can also use similar circuits shown in FIG. 10A through FIG. 10C. Optionally, the first input circuit 110 and the second input circuit 210 have a same circuit structure.

Referring to FIG. 9B, the second output circuit 220 can be achieved by including a ninth transistor M9 and a third capacitor C3. The ninth transistor M9 has a gate terminal coupled to the second node Q2. The ninth transistor M9 has a first terminal configured to receive the fourth clock signal CLKD as a second output signal OUT2. The ninth transistor M9 has a second terminal coupled to the second output terminal OP2 and configured to output the second output signal OUT2. The third capacitor C3 has a first terminal coupled to the second node Q2 and a second terminal coupled to the second terminal of the ninth transistor M9 which is also the second output terminal OP2.

Referring to FIG. 9A, the common-reset circuit 340 can be achieved by including a tenth transistor M10 and an eleventh transistor M11. The tenth transistor M10 has a gate terminal coupled to the fifth node QB_A. The tenth transistor M10 has a first terminal coupled to the fourth node N. The tenth transistor M10 has a second terminal configured to receive the fourth voltage VGL1. The eleventh transistor M11 has a gate terminal coupled to the sixth node QB_B. The eleventh transistor M11 has a first terminal coupled to the fourth node N. The eleventh transistor M11 has a second terminal configured to receive the fourth voltage VGL1.

Referring to FIG. 9A, the first control circuit 130 is achieved by including a twelfth transistor M12 and a thirteenth transistor M13. The twelfth transistor M12 has a gate terminal and a first terminal commonly configured to receive a second voltage VDD_A. The twelfth transistor M12 also has a second terminal coupled to the fifth node QB_A. The thirteenth transistor M13 has a gate terminal coupled to the first node Q1. The thirteenth transistor M13 has a first terminal coupled to the fifth node QB_A. The thirteenth transistor M13 has also has a second terminal configured to receive the fourth voltage VGL1.

Referring to FIG. 9A, the first reset circuit 140 can be achieved by including a fourteenth transistor M14, a fifteenth transistor M15, and a sixteenth transistor M16. The second reset circuit 150 can be achieved by including a seventeenth transistor M17, an eighteenth transistor M18, and a nineteenth transistor M19.

The fourteenth transistor M14 has a gate terminal coupled to the fifth node QB_A, a first terminal coupled to the first node Q1, and a second terminal configured to receive the fourth voltage VGL1. The fifteenth transistor M15 has a gate terminal coupled to the fifth node QB_A, a first terminal coupled to the shift-register output terminal CRT, and a second terminal configured to receive the fourth voltage VGL1. The sixteenth transistor M16 has a gate terminal coupled to the fifth node QB_A, a first terminal coupled to the first output terminal OP1, and a second terminal configured to receive a fifth voltage VGL2.

The seventeenth transistor M17 has a gate terminal coupled to the sixth node QB_B, a first terminal coupled to the first node Q1, and a second terminal configured to receive the fourth voltage VGL1. The eighteenth transistor M18 has a gate terminal coupled to the sixth node QB_B, a first terminal coupled to the shift-register output terminal CRT, and a second terminal configured to receive the fourth voltage VGL1. The nineteenth transistor M19 has a gate terminal coupled to the sixth node QB_B, a first terminal coupled to the first output terminal OP1, and a second terminal configured to receive the fifth voltage VGL2.

Referring to FIG. 9B again, the second control circuit 230 can be achieved by including a twentieth transistor M20 and a twenty-first transistor M21. The twentieth transistor M20 has a gate terminal and a first terminal commonly configured to receive a third voltage VDD_B. The twentieth transistor M20 has a second terminal coupled to the sixth node QB_B. The twenty-first transistor M21 has a gate terminal coupled to the second node Q2. The twenty-first transistor M21 has a first terminal coupled to the sixth node QB_B. The twenty-first transistor M21 has also a second terminal configured to receive the fourth voltage VGL1.

Referring to FIG. 9B, the third reset circuit 240 includes a twenty-second transistor M22 and a twenty-third transistor M23. The fourth reset circuit 250 includes a twenty-fourth transistor M24 and a twenty-fifth transistor M25.

The twenty-second transistor M22 has a gate terminal coupled to the sixth node QB_B, a first terminal coupled to the second node Q2, and a second terminal configured to receive the fourth voltage VGL1. The twenty-third transistor M23 has a gate terminal coupled to the sixth node QB_B, a first terminal coupled to the second output terminal OP2, and a second terminal configured to receive the fifth voltage VGL2.

The twenty-fourth transistor M24 has a gate terminal coupled to the fifth node QB_A, a first terminal coupled to the second node Q2, and a second terminal configured to receive the fourth voltage VGL1. The twenty-fifth transistor M25 has a gate terminal coupled to the fifth node QB_A, a first terminal coupled to the second output terminal OP2, and a second terminal configured to receive the fifth voltage VGL2.

Optionally, the second voltage VDD_A and the third voltage VDD_B can be set to two out-of-phase voltage signals, i.e., when the second voltage VDD_A is given a high voltage level, the third voltage VDD_B is given a low voltage level, while the second voltage VDD_A is a low voltage level, the third voltage VDD_B is a high voltage level. By setting in this way, only one of the twelfth transistor M12 and the twentieth transistor M20 can be in a conduction state at one time. Thus, it is able to avoid transistor property drift due to long-time being set in the conduction state and to enhance circuitry stability.

Referring to FIG. 9A and FIG. 9B, the first control circuit 130 set in the first circuit 100 is used to control a voltage level of the fifth node QB_A and the second control circuit 230 set in the second circuit 200 is used to control a voltage level of the sixth node QB_B. In this way, numbers of transistors can be reduced in the shift-register unit, making it possible to reduce boarder frame size of a display apparatus that adopts the shift-register unit and enhance its PPI.

Referring to FIG. 9A, the third control circuit 160 includes a thirty-second transistor M32 and a thirty-third transistor M33. The thirty-second transistor M32 has a gate terminal configured to receive a first clock signal CLKA, a first terminal coupled to the fifth node QB_A, and a second terminal coupled to a first terminal of the thirty-third transistor M13. The thirty-third transistor M33 has a gate terminal coupled to the third node H and a second terminal configured to receive the fourth voltage VGL1. The fourth control circuit 170 includes a thirty-fourth transistor M34. The thirty-fourth transistor M34 has a gate terminal configured to receive the first input signal STU1, a first terminal coupled to the fifth node QB_A, and a second terminal configured to receive the fourth voltage VGL1.

Referring to FIG. 9B, the fifth control circuit 260 includes a thirty-fifth transistor M35 and a thirty-sixth transistor M36. The thirty-fifth transistor M35 has a gate terminal configured to receive the first clock signal CLKA, a first terminal coupled to the sixth node QB_B, and a second terminal coupled to a first terminal of the thirty-sixth transistor M36. The thirty-sixth transistor M36 also has a gate terminal coupled to the third node H and a second terminal configured to receive the fourth voltage VGL1. The sixth control circuit 270 includes a thirty-seventh transistor M37 having a gate terminal configured to receive the first input signal STU1, a first terminal coupled to the sixth node QB_B, and a second terminal configured to receive the fourth voltage VGL1.

Referring to FIG. 9A, the fifth reset circuit 180 includes a thirty-eighth transistor M38 and the sixth reset circuit 190 includes a fortieth transistor M40. The thirty-eighth transistor M38 has a gate terminal configured to receive a display-reset signal STD, a first terminal coupled to the first node Q1, and a second terminal configured to receive the fourth voltage VGL1. The fortieth transistor M40 has a gate terminal configured to receive a full-scale reset signal TRST, a first terminal coupled to the first node Q1, and a second terminal configured to receive the fourth voltage VGL1.

Referring to FIG. 9B, the seventh reset circuit 280 includes a thirty-ninth transistor M39 and the eighth reset circuit 290 includes a forty-first transistor M41. The thirty-ninth transistor M39 has a gate terminal configured to receive the display-reset signal STD, a first terminal coupled to the second node Q2, and a second terminal configured to receive the fourth voltage VGL1. The forty-first transistor M41 has a gate terminal configured to receive the full-scale reset signal TRST, a first terminal coupled to the second node Q2, and a second terminal configured to receive the fourth voltage VGL1.

Figure 11A:
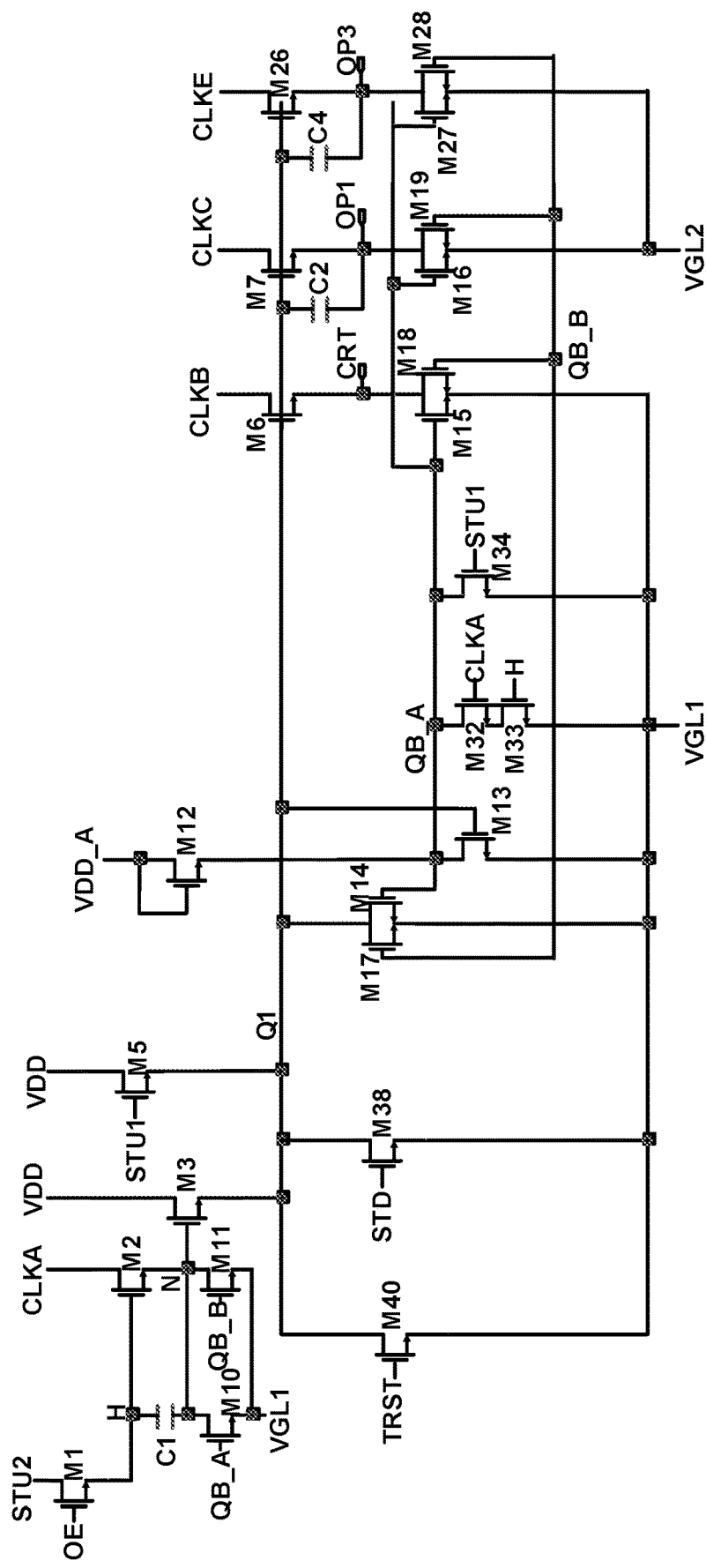
FIG. 11A and FIG. 11B are circuit diagrams of respective a first circuit and a second circuit of a shift-register unit according to another embodiment of the present disclosure.
Figure 11B:
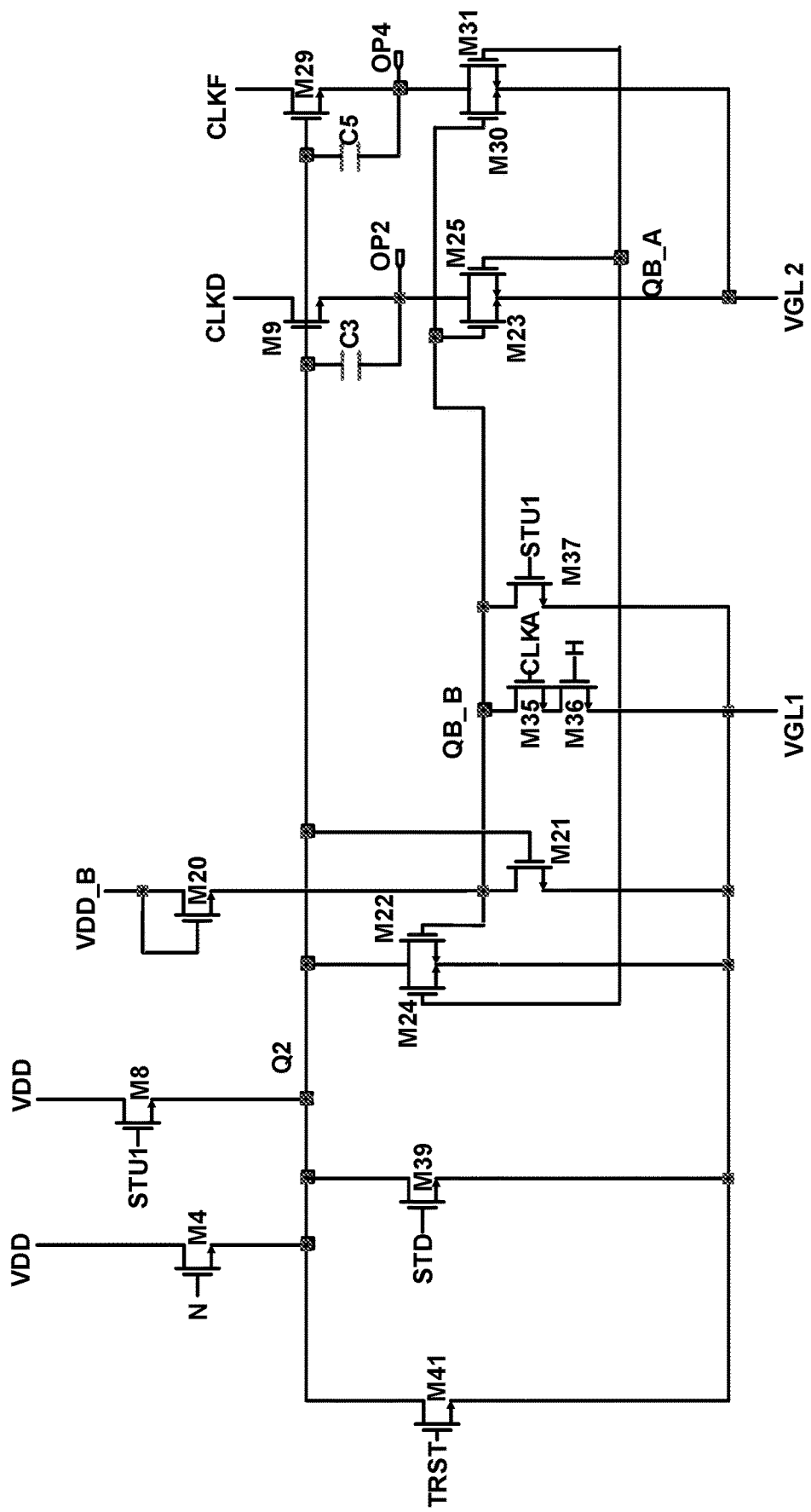

In an alternative embodiment, FIG. 11A and FIG. 11B are circuit diagrams of respective a first circuit and a second circuit of a shift-register unit which is slightly different from those shown in FIG. 9A and FIG. 9B of the present disclosure. Referring to FIG. 11A and FIG. 11B, the first circuit 100, in addition to the circuits shown in FIG. 9A and FIG. 9B, further includes a third output terminal OP3. The third output terminal OP3 is configured to output a third output signal OUT3. The second circuit 200, in addition to the circuits shown in FIG. 9A and FIG. 9B, further includes a fourth output terminal OP4 configured to output a fourth output signal OUT4. Correspondingly, the first reset circuit 140 and the second reset circuit 150 are also configured to reset the third output terminal OP3. The third reset circuit 240 and the fourth reset circuit 250 are also configured to reset the fourth output terminal OP4.

Referring to FIG. 11A, the first output circuit 120, in addition to the circuit shown in FIG. 9A, further includes a twenty-sixth transistor M26 and a fourth capacitor C4. The twenty-sixth transistor M26 has a gate terminal coupled to the first node Q1, a first terminal configured to receive a fifth clock signal CLKE, and a second terminal coupled to the third output terminal OP3. The fourth capacitor C4 has a first terminal coupled to the first node Q1 and a second terminal coupled to the third output terminal OP3.

In an example, the fifth clock signal CLKE is configured to be the same as the third clock signal CLKC. In another example, the fifth clock signal CLKE is configured to be different from the third clock signal CLKC so that the first output terminal OP1 and the third output terminal OP3 can output different signals, enhancing multiplicity capability of the shift-register unit of providing multiple different driving signals.

The first reset circuit 140 in FIG. 11A also includes a twenty-seventh transistor M27 having a gate terminal coupled to the fifth node QB_A, a first terminal coupled to the third output terminal OP3, and a second terminal configured to receive the fifth voltage VGL2. The second reset circuit 150 in FIG. 11A also includes a twenty-eighth transistor M28 having a gate terminal coupled to the sixth node QB_B, a first terminal coupled to the third output terminal OP3, and a second terminal configured to receive the fifth voltage VGL2.

Referring to FIG. 11B, the second output circuit 220, in addition to the circuit of FIG. 9B, also includes a twenty-ninth transistor M29 and a fifth capacitor C5. The twenty-ninth transistor M29 has a gate terminal coupled to the second node Q2, a first terminal configured to receive a sixth clock signal CLKF, and a second terminal coupled to the fourth output terminal OP4. The fifth capacitor C5 has a first terminal coupled to the second node Q2 and a second terminal coupled to the fourth output terminal OP4.

In an embodiment, the sixth clock signal CLKF is configured to be the same as the fourth clock signal CLKD. In another embodiment, the sixth clock signal CLKF is configured to be different from the fourth clock signal CLKD so that the second output terminal OP2 and the fourth output terminal OP4 can respectively output different signals, enhancing multiplicity capability of the shift-register unit of providing multiple different driving signals.

The third reset circuit 240 in FIG. 11B also includes a thirtieth transistor M30 having a gate terminal coupled to the sixth node QB_B, a first terminal coupled to the fourth output terminal OP4, and a second terminal configured to receive the fifth voltage VGL2. The fourth reset circuit 250 in FIG. 11B also includes a thirty-first transistor M31 having a gate terminal coupled to the fifth node QB_A, a first terminal coupled to the fourth output terminal OP4, and a second terminal configured to receive the fifth voltage VGL2.

As described above, in the shift-register unit 10 (or 10A, 10B, 10C) provided by the embodiment of the present disclosure, the voltage level at the third node H can be maintained by the first capacitor C1. The voltage level at first node Q1 can be maintained (at least within 10% of error) by the second capacitor C2 and the fourth capacitor C4. The voltage level at the second node Q2 is maintained by the third capacitor C3 and the fifth capacitor C5. The first capacitor C1, the second capacitor C2, the third capacitor C3, the fourth capacitor C4, and the fifth capacitor C5 may be capacitor devices fabricated by a thin-film process, for example, by fabricating a special capacitor electrode to implement a capacitor device. The electrodes may be implemented by a metal layer, a semiconductor layer (e.g., doped polysilicon), or the like, or in some examples, by designing circuit routing parameters such that the first capacitor C1, the second capacitor C2, the third capacitor C3, the fourth capacitor C4, and the fifth capacitor C5 can also be realized by the parasitic capacitance between the various devices. The connection manner of the first capacitor C1, the second capacitor C2, the third capacitor C3, the fourth capacitor C4, and the fifth capacitor C5 is not limited to the manner shown above. There may be other suitable connection manners, as long as the storage of charges can be written to the voltage level of the third node H, the first node Q1 and the second node Q2.

When the first node Q1, the second node Q2, or the third node H are maintained at a high voltage level, some transistors (such as the first transistor M1, the fourteenth transistor M14, the seventeenth transistor M17, the thirty-eighth transistor M38, the fortieth transistor M40, the twenty-second transistor M22, the twenty-fourth transistor M24, the thirty-ninth transistor M39, and the forty-first transistor M41) have their first terminals coupled respectively to the first node Q1, the second node Q2, or the third node H while their second terminals coupled to a low voltage level. Even though these transistors have their gate terminals receiving a turn-off signal, there still may be current leaking across the first terminals and the second terminals due to the difference of voltage levels between them. The current leaking problem will result in poor stability of maintaining voltage level respectively at the first node Q1, the second node Q2, or the third node H.

Figure 12A:
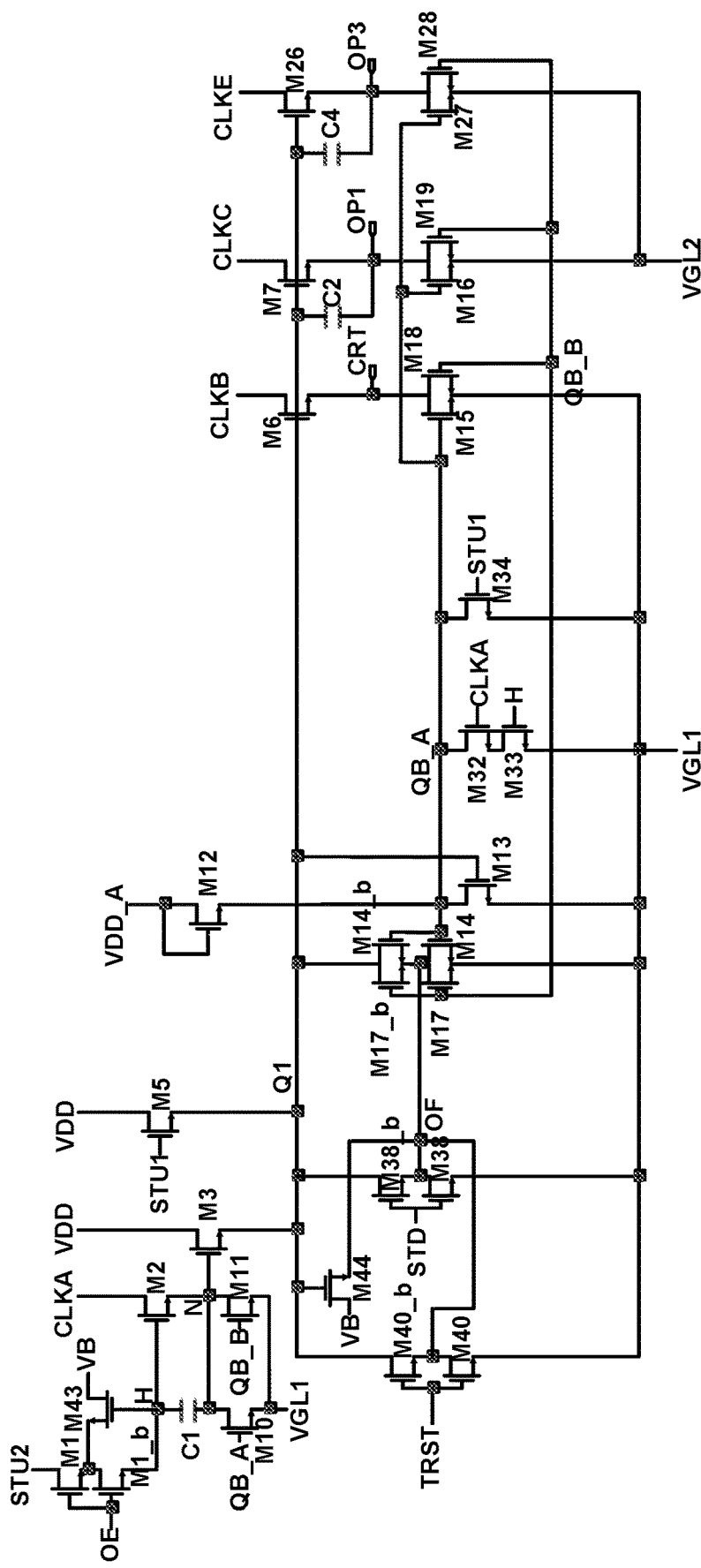
FIG. 12A through FIG. 12C are circuit diagrams of a shift-register unit with anti-leak circuitry structures according to some embodiments of the present disclosure.
Figure 12B:
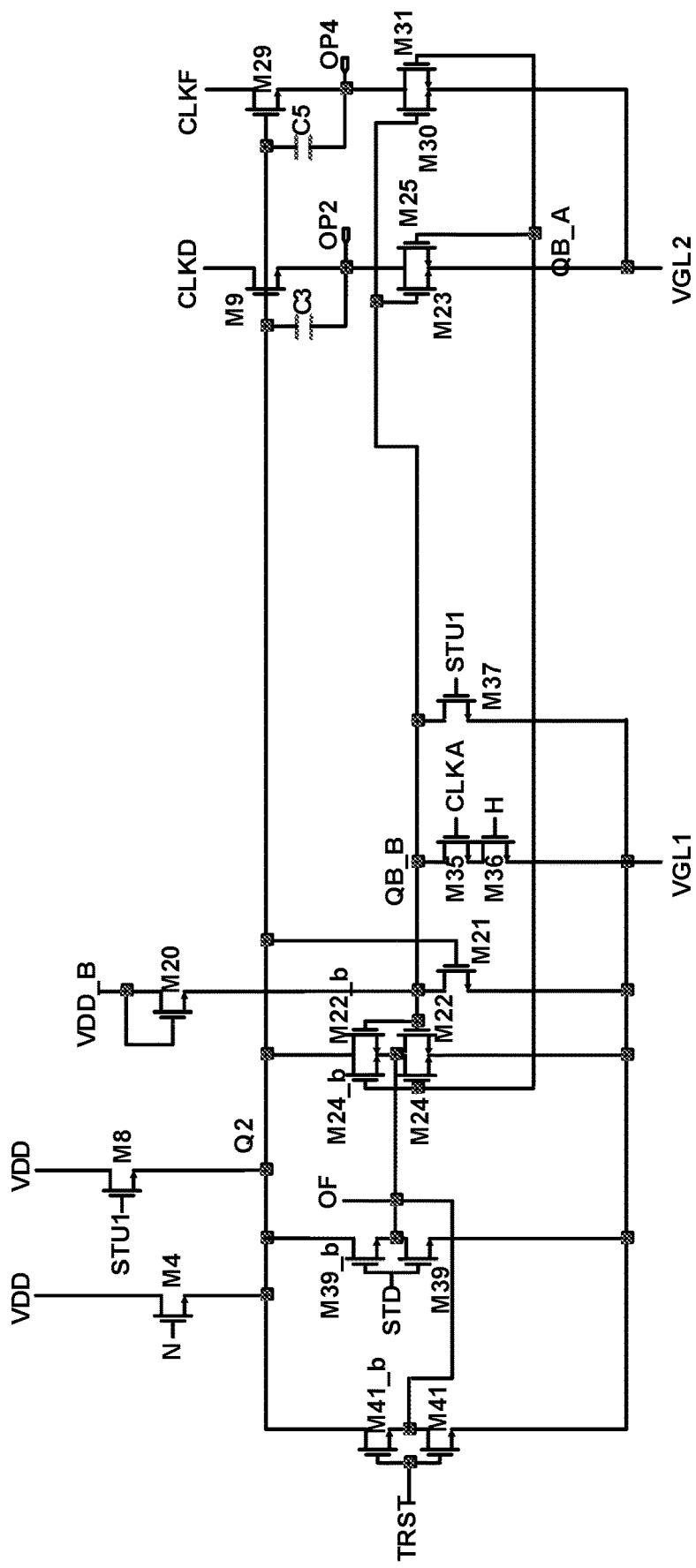
Figure 12C:
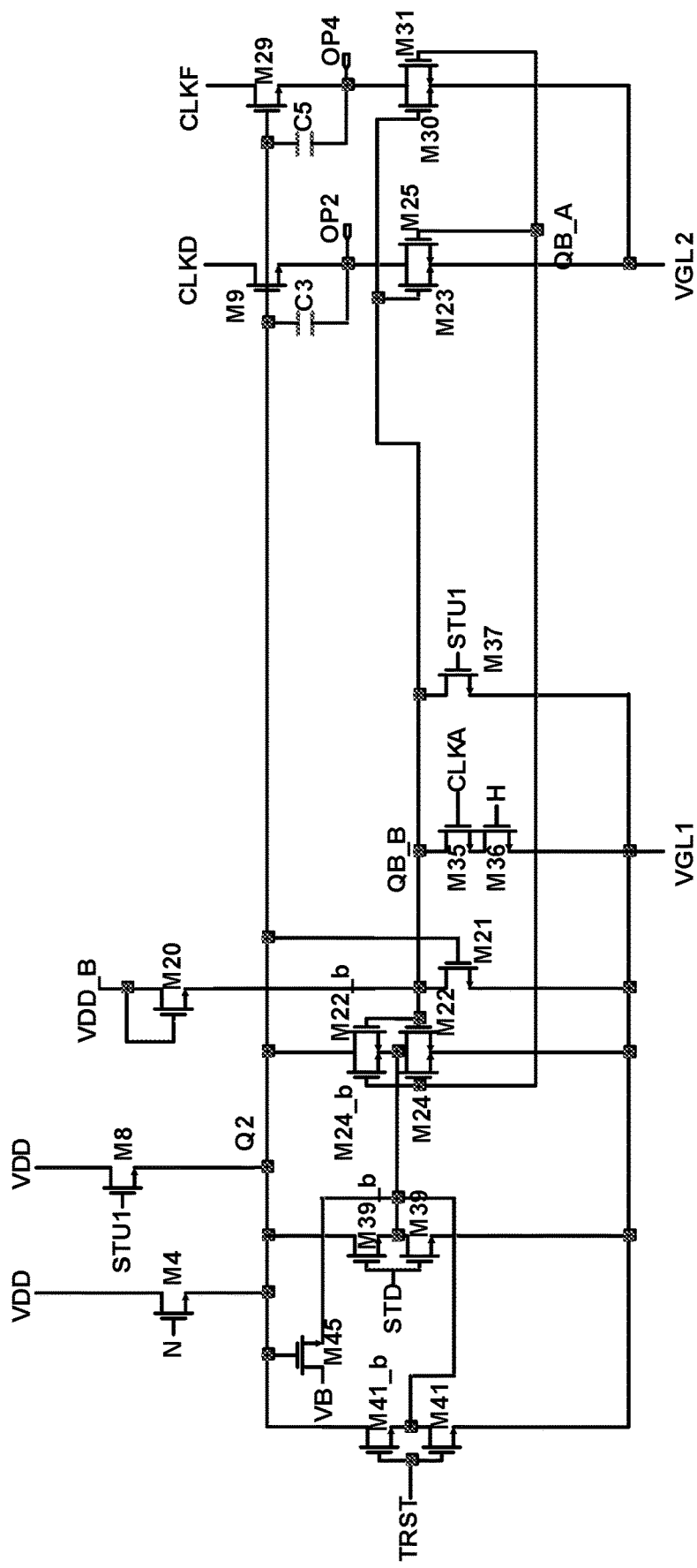

FIG. 12A through FIG. 12C are circuit diagrams of a shift-register unit with anti-leak circuitry structures according to some embodiments of the present disclosure. Referring to FIG. 12A and FIG. 12B, the shift-register unit also includes a common anti-leak circuit, a first anti-leak circuit and a second anti-leak circuit. In particular, the common anti-leak circuit is connected electrically to the first node Q1 and a seventh node OF and is configured to control a voltage level of the seventh node OF in response to the voltage level of the first node Q1. The first anti-leak circuit is connected to the seventh node OF, the first reset circuit 140, the second reset circuit 150, the fifth reset circuit 180, and the sixth reset circuit 190, and configured to prevent current leaking at the first node Q1 in response to a voltage level of the seventh node OF. The second anti-leak circuit is connected to the seventh node OF, the third reset circuit 240, the fourth reset circuit 250, the seventh reset circuit 280, and the eighth reset circuit 290, and configured to prevent current leaking at the second node Q2 in response to the voltage level at the seventh node OF.

For example, as shown as FIG. 12A and FIG. 12B, the common anti-leak circuit includes a forty-fourth transistor M44 having a gate terminal coupled to the first node Q1, a first terminal configured to receive a sixth voltage VB, and a second terminal coupled to the seventh node OF. The first anti-leak circuit includes transistors M14_b, M17_b, M38_b, and M40_b. The second anti-leak circuit includes transistors M22_b, M24_b, M39_b, and M41_b.

Additionally, referring to FIG. 12A, in order to prevent current leaking from the third node H, a forty-third transistor M43 and a transistor M1_b are added in the circuit. The transistor M1_b has a gate terminal coupled to the gate of the first transistor M1. The transistor M1_b has a first terminal coupled to the second terminal of the forty-third transistor M43. The transistor M1_b has a second terminal coupled to the third node H. The forty-third transistor M43 has a gate terminal coupled to the third node H. The forty-third transistor M43 has a first terminal configured to receive the sixth voltage VB (at a high voltage). When the third node H is given a high voltage level, the forty-third transistor M43 is turned on so that the sixth voltage VB at the high voltage level can be inputted to the first terminal of the transistor M1_b, making both the first terminal and the second terminal of the transistor M1_b at high voltage level and preventing charges at the third node H to leak through the transistor M1_b. At this time, the gate terminal of the transistor M1_b is coupled to the gate terminal of the first transistor M1. The combination of the first transistor M1 and the transistor M1_b can realize the same function of the first transistor M1 and prevent current leaking at the same time.

Similarly, as shown in FIG. 12A, transistors M14_b, M17_b, M38_b, and M40_b can connect with the forty-fourth transistor M44 through the seventh node OF to respectively achieve anti-leak functions of preventing current leaking from the first node Q1. As shown in FIG. 12B, transistors M22_b, M24_b, M39_b, and M41_b also can connect with the forty-fourth transistor M44 through the seventh node OF to respectively achieve anti-leak functions of preventing current leaking from the second node Q2. Referring to FIG. 12A and FIG. 12B, the first anti-leak circuit and the second anti-leak circuit shares one forty-fourth transistor M44 to save the number of transistors, reducing the boarder frame size and enhancing PPI of the display apparatus.

In an alternative embodiment shown in FIG. 12C, the second anti-leak circuit (Transistors M22_b, M24_b, M39_b, and M41_b) associated with the second circuit of the shift-register unit is not connected to the seventh node OF shared with the first circuit of the shift-register unit. Instead, the second anti-leak circuit mentioned here is set to couple with a standalone eighth node commonly connected with a separate forty-fifth transistor M45 to form the anti-leak structure.

Similarly, as shown in FIG. 6, for the third transistor M3 and the fourth transistor M4, two different transistors M3_b and M4_b can be setup to realize the anti-leak structure. In particular, the transistors M3_b and M4_b have their gate terminals configured to receive the first clock signal CLKA and their first terminals coupled to the seventh node OF to establish the anti-leak structure with a connection to the forty-fourth transistor M44 of FIG. 12A. This anti-leak structure can prevent current leaking from both the first node Q1 and the second node Q2.

Also shown in FIG. 10C, for the fifth transistor M5, a transistor M5_b can be added to set up the anti-leak structure. In particular, the gate terminal of the transistor M5_b is configured to receive the first input signal STU1, the first terminal of the transistor M5_b is coupled to the seventh node OF, establishing a connection with the forty-fourth transistor M44 of FIG. 12A. The anti-leak structure can prevent current leaking from the first node Q1.

Figure 13A:
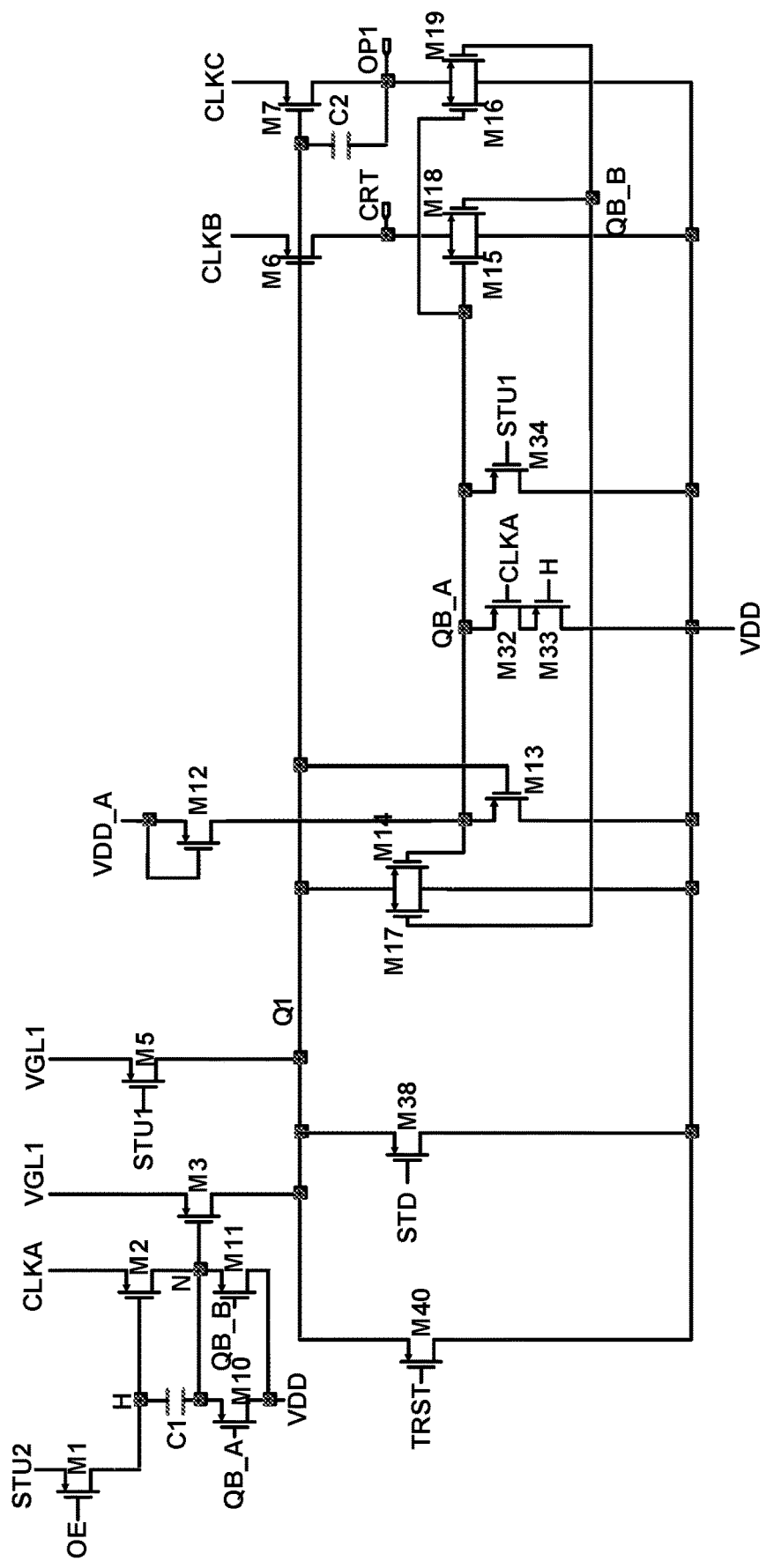
FIG. 13A and FIG. 13B are circuit diagrams of respective a first circuit and a second circuit of a shift-register unit according to yet another embodiment of the present disclosure.
Figure 13B:
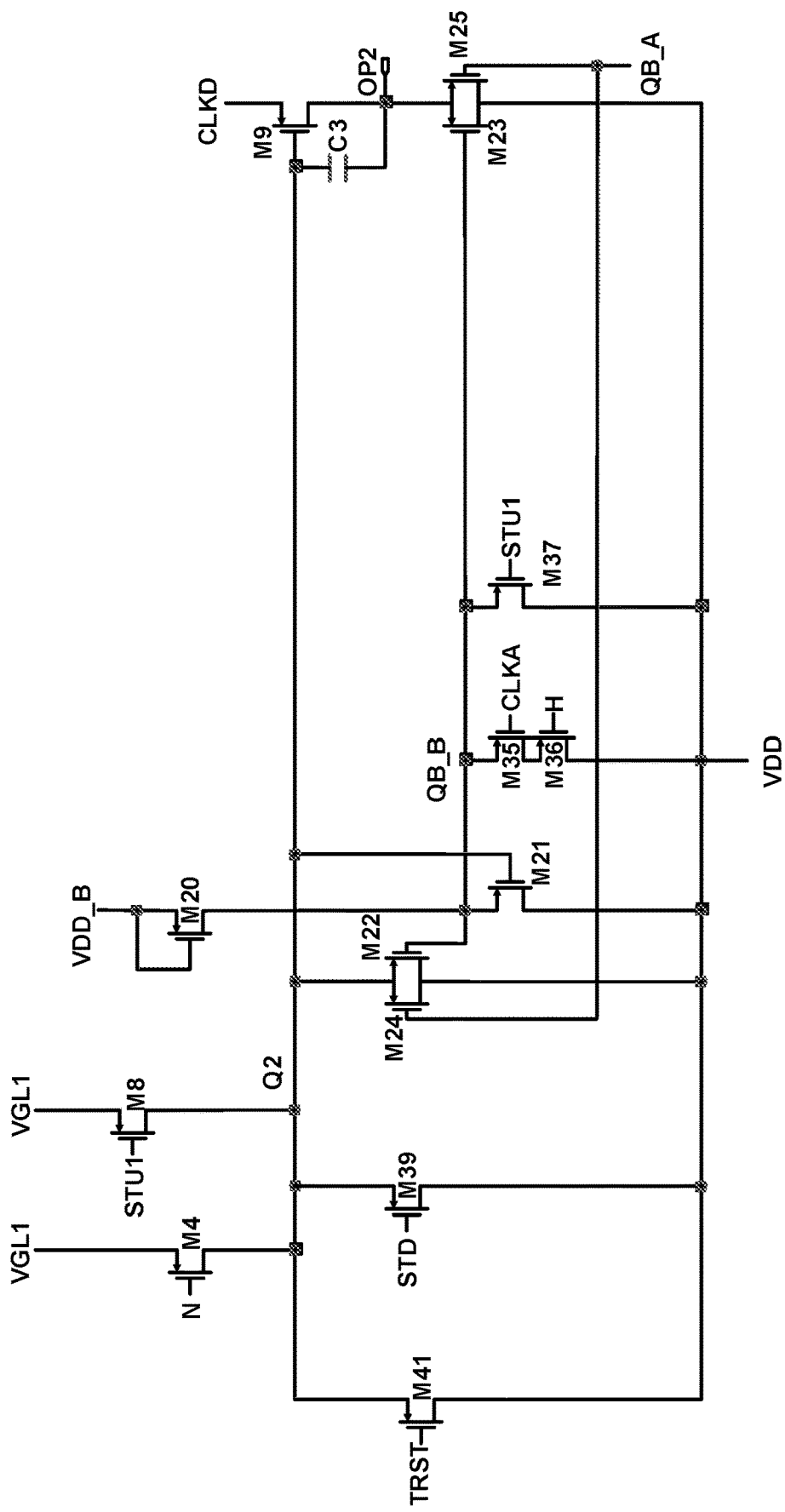

In an alternative embodiment, scanning transistors and sensing transistors in the subpixel units of a display panel can also be chosen as P-type transistors. In the case, FIG. 13A and FIG. 13B show circuit diagrams of respective a first circuit and a second circuit of a shift-register unit according to yet another embodiment of the present disclosure. The shift-register unit shown in FIG. 13A and FIG. 13B can be used as one of multiple units cascaded to form a gate-driving circuit and be implemented in the display panel to drive display scanning and external compensation.

The transistors used in the embodiments of the present disclosure may each be a thin film transistor or a field effect transistor or other switching device having the same characteristics. In the embodiments of the present disclosure, a thin film transistor is taken as an example for description. The source and drain of the transistor used here may be structurally symmetrical, so that the source and the drain may be structurally indistinguishable. In the embodiment of the present disclosure, in order to distinguish the two terminals of the transistor except the gate terminal, one of the two terminals is called the first terminal and the other is called a second terminal. In addition, the transistors can be divided into N-type and P-type transistors according to the characteristics of the transistors. When the transistor is a P-type transistor, the turn-on voltage is a low voltage (e.g., 0V, −5V, −10V, or other suitable voltage), and the turn-off voltage is a high voltage (e.g., 5V, 10V, or other suitable voltage). When the transistor is an N-type transistor, the turn-on voltage is a high voltage (for example, 5V, 10V or other suitable voltage), and the turn-off voltage is a low voltage (for example, 0V, −5V, −10V or other suitable voltage).

Figure 14:
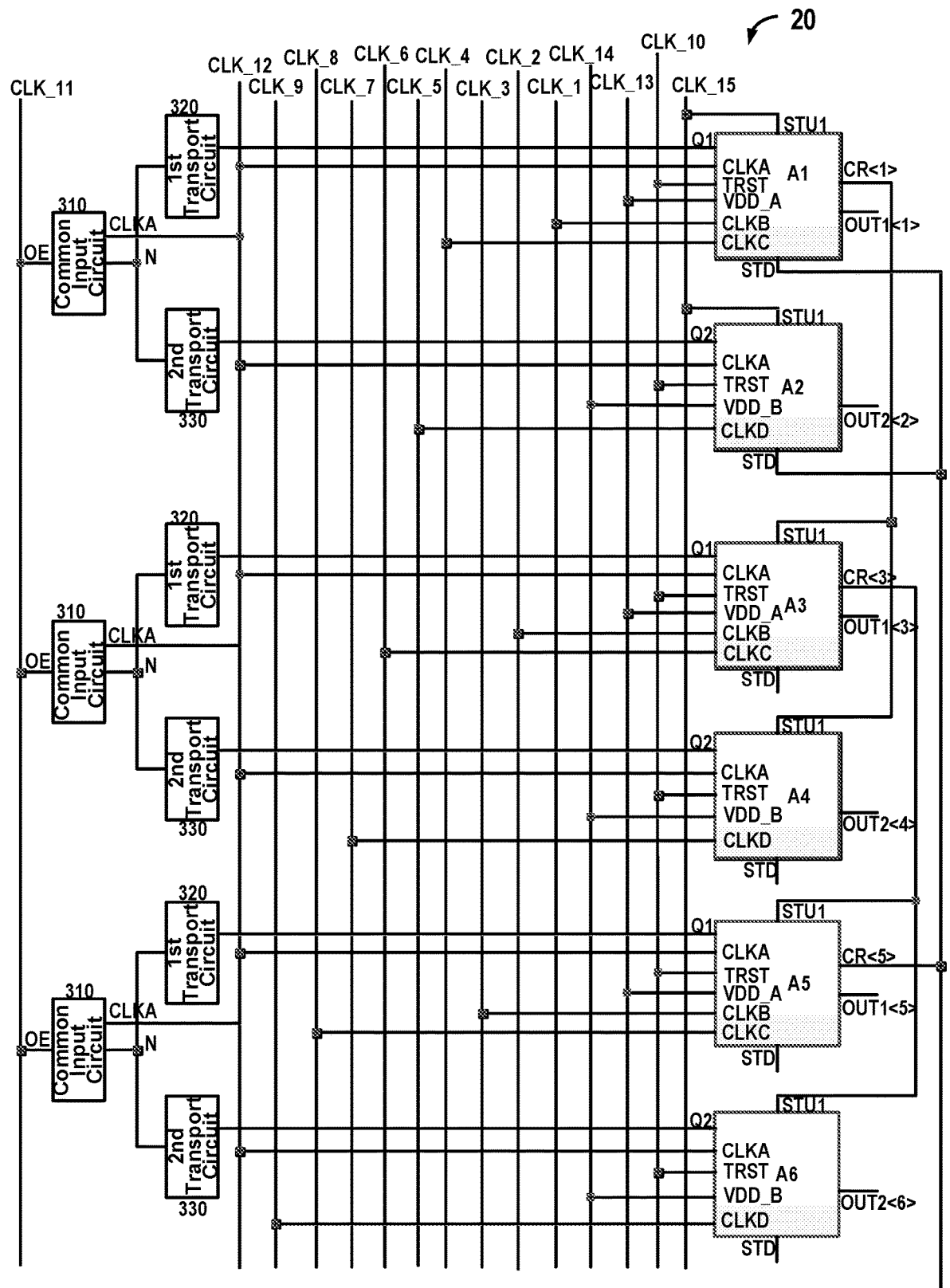
FIG. 14 is a schematic diagram of a gate-driving circuit according to an embodiment of the present disclosure.

In another aspect, the present disclosure provides a gate-driving circuit made by cascading multiple shift-register units in a multi-stage series. FIG. 14 shows a schematic diagram of a gate-driving circuit according to an embodiment of the present disclosure. Referring to FIG. 14, the gate-driving circuit 20 includes multiple stages of shift-register units 10. Here a respective one of the multiple shift-register units is substantially the shift-register unit 10 described herein throughout the specification. Denotations of A1, A2, A3, A4, A5, and A6 in FIG. 14 respectively represent a circuit of the shift-register unit 10. For example, A1, A3, and A5 respectively represent three first circuits of three shift-register units and A2, A4, and A6 respectively represent three second circuits of the three shift-register units.

Referring to FIG. 14, the respective one shift-register unit 10 includes a first circuit and a second circuit, respectively outputting a first output signal OUT1 and a second output signal OUT2. When the gate-driving circuit 20 is applied to drive a display panel, the first output signal OUT1 and the second output signal OUT2 can separately drive one row of subpixel units of the display panel. For example, A1, A2, A3, A4, A5, and A6 can respectively drive a first row, a second row, a third row, a fourth row, a fifth row, and a sixth row of subpixel units in the display panel.

The gate-driving circuit 20 of the present disclosure shares a blank-input circuit to reduce the boarder frame size of the display apparatus that adopts the gate-driving circuit and enhance the PPI of the display apparatus. At the same time, the gate-driving circuit provides external compensation to the driving transistors in randomly selected rows of subpixel units, avoiding revelation of a virtual scanning line on the display panel and brightness nonuniformity caused by sequential line-by-line compensation.

Referring to FIG. 14, the gate-driving circuit 20, cascaded by multi-stages of shift-register units 10, includes a first sub-clock signal line CLK_1, a second sub-clock signal line CLK_2, a third sub-clock signal line CLK_3. A (3n−2)-th stage of shift-register unit has a first circuit connected to the first sub-clock signal line CLK_1 to receive a second clock signal CLKB of the (3n−2)-th stage of shift-register unit. A (3n−1)-th stage of shift-register unit has a first circuit connected to the second sub-clock signal line CLK_2 to receive the second clock signal CLKB of the (3n−1)-th stage of shift-register unit. A 3n-th stage of shift-register unit has a first circuit connected to the third sub-clock signal line CLK_3 to receive the second clock signal CLKB of the 3n-th stage of the shift-register unit. Here n is a positive integer. As shown, it is an option to provide the second clock signal CLKB to every respective first circuit of every stage of shift-register unit that serves one cascaded member of the gate-driving circuit. The second clock signal CLKB can be used as a shift-register signal CR outputted for driving the shifted scanning through the display panel.

Referring to FIG. 14, the gate-driving circuit 20 also includes a fourth sub-clock signal line CLK_4, a fifth sub-clock signal line CLK_5, a sixth sub-clock signal line CLK_6, a seventh sub-clock signal line CLK_7, an eighth sub-clock signal line CLK_8, and a ninth sub-clock signal line CLK_9.

The (3n−2)-th stage of shift-register unit has its first circuit connected to the fourth sub-clock signal line CLK_4 to receive a third clock signal CLKC of the (3n−2)-th stage of shift-register unit. The (3n−2)-th stage of shift-register unit has its second circuit connected to the fifth sub-clock signal line CLK_5 to receive a fourth clock signal CLKD of the (3n−2)-th stage of shift-register unit.

The (3n−1)-th stage of shift-register unit has its first circuit connected to the sixth sub-clock signal line CLK_6 to receive a third clock signal CLKC of the (3n−1)-th stage of shift-register unit. The (3n−1)-th stage of shift-register unit has its second circuit connected to the seventh sub-clock signal line CLK_7 to receive a fourth clock signal CLKD of the (3n−1)-th stage of shift-register unit.

The 3n-th stage of shift-register unit has its first circuit connected to the eighth sub-clock signal line CLK_8 to receive a third clock signal CLKC of the 3n-th stage of shift-register unit. The 3n-th stage of shift-register unit has its second circuit connected to the ninth sub-clock signal line CLK_9 to receive a fourth clock signal CLKD of the 3n-th stage of shift-register unit.

Through six clock signal lines, the fourth sub-clock signal line CLK_4, the fifth sub-clock signal line CLK_5, the sixth sub-clock signal line CLK_6, the seventh sub-clock signal line CLK_7, the eighth sub-clock signal line CLK_8, and the ninth sub-clock signal line CLK_9, signals are provided to respective stage of the shift-register unit sequentially one stage after another for outputting as respective driving signals. In the embodiment, the gate-driving circuit 20 adopts six clock signals. Thus, the driving signals outputted from the gate-driving circuit have overlapping waveforms. Optionally, a precharging time for every row of subpixel units can be effectively increased so that the gate-driving circuit can be suitable for high-frequency scanning display. Alternatively, the gate-driving circuit 20 adopts eight clock signals. Optionally, the gate-driving circuit 20 adopts 10 clock signals.

Referring to FIG. 14, the gate-driving circuit 20 further includes a tenth sub-clock signal line CLK_10, an eleventh sub-clock signal line CLK_11, and a twelfth sub-clock signal line CLK_12. Every stage of shift-register unit 10 has a first circuit and a second circuit commonly connected to the tenth sub-clock signal line CLK_10 to receive a full-scale reset signal TRST. Every stage of shift-register unit 10 has a common-input circuit 310 commonly connected to the eleventh sub-clock signal line CLK_11 to receive a select-control signal OE. Every stage of shift-register unit 10 has a first circuit and a second circuit and the common-input circuit 310 commonly connected to the twelfth sub-clock signal line CLK_12 to receive a first clock signal CLKA.

Referring to FIG. 14, the gate-driving circuit 20 furthermore includes a thirteenth sub-clock signal line CLK_13 and a fourteenth sub-clock signal line CLK_14. Every stage of shift-register unit 10 has a first circuit connected to the thirteenth sub-clock signal line CLK_13 to receive a second voltage VDD_A. Every stage of shift-register unit 10 has a second circuit connected to the fourteenth sub-clock signal line CLK_14 to receive a third voltage VDD_B.

Referring to FIG. 14, the gate-driving circuit 20 moreover includes a fifteenth sub-clock signal line CLK_15. A first stage of shift-register unit 10 has a first circuit and a second circuit, both connected to the fifteenth sub-clock signal line CLK_15 to receive a first input signal STU1.

Referring to FIG. 14, in some embodiments, the first input signal STU1 of at least one stage of first four stages of the gate-driving circuit is a clock signal. Optionally, the first input signal STU1 of at least one stage comprises a carry signal (e.g., the shift-register signal CR<1>, CR<3>, or CR<5>) of a corresponding previous stage. Similarly, in some embodiments, the second input signal STU2 of at least one stage comprises a carry signal of a corresponding previous stage.

Referring to FIG. 14, except the first stage of shift-register unit 10, every other stage of shift-register unit has a first circuit and a second circuit configured to connect to the first circuit in a previous stage of shift-register unit 10 to receive the shift-register signal CR as its own first input signal STU1. Except the last two stages of shift-register units, every other stage of shift-register unit 10 has a first circuit and a second circuit configured to connect to a first circuit of a second next stage of shift-register unit 10 to receive the shift-register signal CR as its own display-reset signal STD.

FIG. 14 is merely one of many examples in terms of the stage-to-stage cascading manner. In an embodiment, the shift-register unit 10 in the gate-driving circuit 20 can adopt circuit structures shown in FIG. 9A and FIG. 9B.

Figure 15:
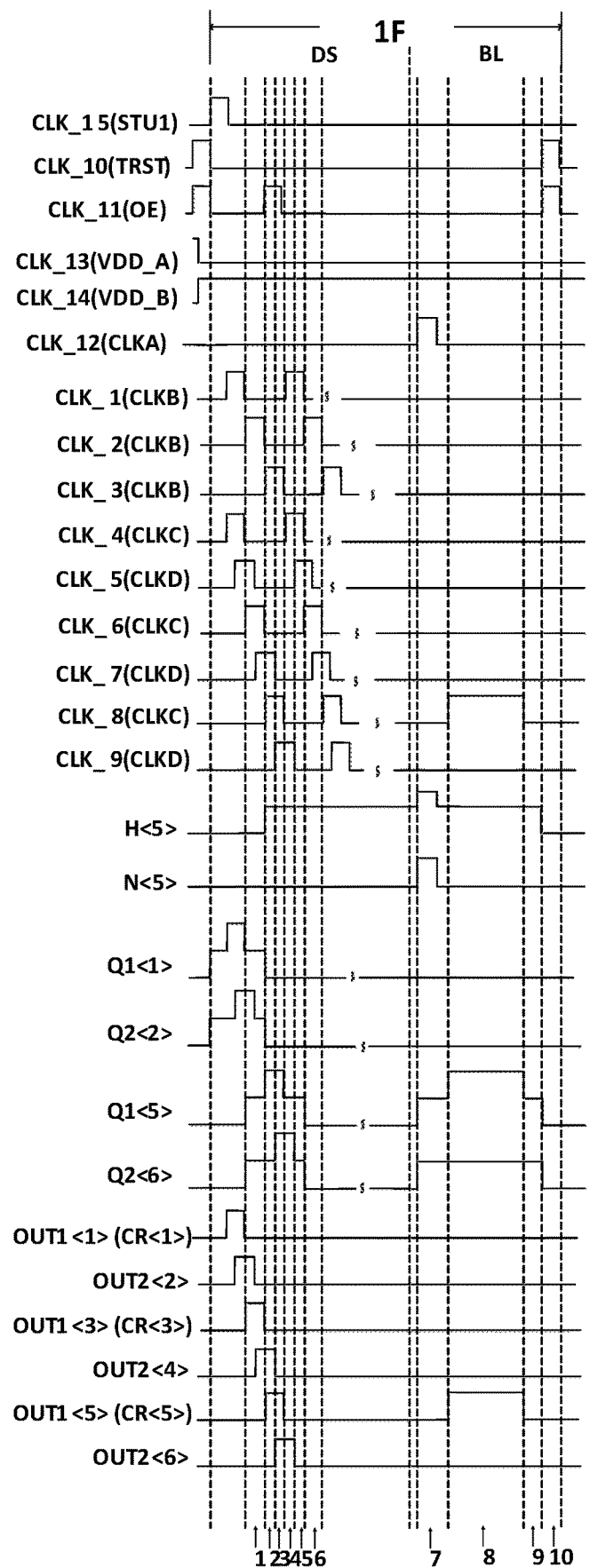
FIG. 15 is a timing diagram of operating a gate-driving circuit of FIG. 14 according to an embodiment of the present disclosure.

FIG. 15 is a timing diagram of operating a gate-driving circuit of FIG. 14 according to an embodiment of the present disclosure. Referring to FIG. 15, H<5> represents a third node H in a third-stage of shift-register unit 10. The third-stage of shift-register unit 10 corresponds to a fifth row and a sixth row of subpixel units in a display panel. N<5> represents a fourth node N in the third-stage of shift-register unit 10. Q1<1> and Q2<2> respectively represent a first node Q1 and a second node Q2 of a first-stage of shift-register unit 10. Q1<5> and Q2<6> respectively represent a first node Q1 and a second node Q2 of a third-stage of shift-register unit 10. The number in < > bracket represents a row number of a row of subpixel units in the display panel corresponding to the nodes Q1 and Q2.

OUT1<1> and OUT2<2> respectively represent a first output signal OUT1 and a second output signal OUT2 outputted from the first-stage of shift-register unit 10. Similarly, OUT1<3> and OUT2<4> respectively represent the first output signal OUT1 and the second output signal OUT2 outputted from a second-stage of shift-register unit 10. OUT1<5> and OUT2<6> respectively represent the first output signal OUT1 and the second output signal OUT2 outputted from the third-stage of shift-register unit 10. CR<1>, CR<3>, and CR<5> respectively represent a shift-register signal CR outputted from the first-stage, the second-stage, and the third-stage of shift-register unit 10. Referring to FIG. 15, in an example, CR<1> is the same as OUT1<1>. CR<3> is the same as OUT1<3>. CR<5> is the same as OUT1<5>.

1F represents a first frame (a cycle time of displaying one frame of image). DS represents a display period in the first frame. BL represents a blank period of the first frame. In an example shown in FIG. 15, the second voltage VDD_A is provided as a low voltage and the third voltage VDD_B is provided as a high voltage.

Before the first frame (of displaying one frame of image) 1F starts, the tenth sub-clock signal line CLK_10 and the eleventh sub-clock signal line CLK_11 both provide high voltage signals. A fortieth transistor M40 and a forty-first transistor M41 in every stage of shift-register unit 10 are both turned on. Voltage levels at the first node Q1 and the second node Q2 of every stage of shift-register unit 10 are reset. A first transistor M1 in every stage of shift-register unit 10 is also turned on. A second input signal STU2 received at this time is a low voltage signal, which is used to reset voltage level of the third node H in every stage of shift-register unit 10 so that a full-scale reset is accomplished before the first frame 1F starts.

In a display period DS of the first frame 1F, an operation of a third-stage shift-register unit 10 (corresponding to the fifth and sixth rows of subpixel units in the display panel) is cited here as an example for describing how the gate-driving circuit 20 is driving the display panel for displaying image frame-by-frame.

In a first period 1 of DS, the second-stage shift-register unit 10 has a first circuit outputting a shift-register signal CR<3> as a high voltage signal. This is used as a first input signal STU1 of a next, i.e., the third-stage shift-register unit 10. In other words, the third-stage of shift-register unit receives a first input signal STU1 at a high voltage. Thus, a fifth transistor M5 and an eighth transistor M8 in the third-stage of shift-register unit 10 are both turned on. A first voltage VDD, which is provided with a high voltage from a power supply, is charging the first node Q1<5> through the fifth transistor M5 and is charging the second node Q2<6> through the eighth transistor M8. Therefore, both the first node Q1<5> and the second node Q2<6> are pulled up to a high voltage level.

A seventh transistor M7 in the third-stage of shift-register unit 10 is turned on by the high voltage at the first node Q1<5>. But at this time, a third clock signal CLKC provided via the eighth sub-clock signal line CLK_8 is a low voltage signal. So, the first output signal OUT1<5> from the third-stage of shift-register unit 10 is a low voltage signal. A ninth transistor M9 in the third-stage of shift-register unit 10 is turned on by the high voltage at the second node Q2<6>. But at this time, a fourth clock signal CLKD provided via the ninth sub-clock signal line CLK_9 is a low voltage signal. So, the second output signal OUT2<6> from the third-stage of shift-register unit 10 also is a low voltage signal. In this period 1, a precharging operation to both the first node and the second node in the third-stage of shift-register unit has been accomplished.

In a second period 2 of DS, the third clock signal CLKC provided via the eighth sub-clock signal line CLK_8 is changed to a high voltage signal. Voltage level at the first node Q1<5> is further pulled up higher by a bootstrap effect to maintain the seventh transistor M7 in conduction state. The first output signal OUT1<5> from the third-stage of shift-register unit 10 is, from the CLKC, also changed to a high voltage signal. But at this time, the fourth clock signal CLKD provided via the ninth sub-clock signal line CLK_9 remains a low voltage signal. So, the second output signal OUT2<6> from the third-stage of shift-register unit 10 continues to be a low voltage signal.

In a third period 3 of DS, the fourth clock signal CLKD provided via the ninth sub-clock signal line CLK_9 is changed to a high voltage signal. The voltage level at the second node Q2<6> is pulled up higher by bootstrap effect. The ninth transistor M9 is maintained in conduction state. Thus, the second output signal OUT2<6> outputted from the third-stage of shift-register unit 10 becomes a high voltage signal.

In a fourth period 4 of DS, because of charge maintaining effect of a second capacitor C2, the first node Q1<5> remains at the high voltage level. Thus, the seventh transistor M7 is in conduction state. But the third clock signal CLKC provided via the eighth sub-clock signal line CLK_8 is changed to a low voltage signal. Thus, the first output signal OUT1<5> from the third-stage of shift-register unit 10 also changes to a low voltage signal. At the same time, due to the bootstrap effect of a second capacitor C2, the voltage level at the first node Q1<5> is also relatively lowered.

In a fifth period 5 of DS, because of charge maintaining effect of a third capacitor C3, the second node Q2<6> remains at the high voltage level. Thus, the ninth transistor M9 is in conduction state. But the fourth clock signal CLKD provided via the ninth sub-clock signal line CLK_9 is changed to a low voltage signal. Thus, the second output signal OUT2<6> from the third-stage of shift-register unit 10 also changes to a low voltage signal. At the same time, due to the bootstrap effect of a third capacitor C3, the voltage level at the first node Q2<6> is also relatively lowered.

In a sixth period 6 of DS, based on an assumption of adopting six clock signals for the gate-driving circuit 20, signals (i.e., the first output signal OUT1 and the second output signal OUT2 from every stage) outputted from every three stages of shift-register units 10 will repeat themselves in a cycle. At the same time, the third-stage of shift-register unit 10 is configured to receive a shift-register signal CR from a fifth-stage of shift-register unit as its own display-reset signal STD. During the sixth period 6, the third clock signal CLKC provided via a sixth sub-clock signal line CLK_6 is changed to a high voltage signal. Then, the display-reset signal STD received by the third-stage of shift-register unit 10 is also a high voltage signal, making a thirty-eighth transistor M38 and a thirty-ninth transistor M39 both in conduction state. Therefore, a fourth voltage VGL1 provided with a low voltage can be used to complete a pull-down or reset operation to the first node Q1<5> and the second node Q2<6>.

After the third-stage of shift-register unit 10 drives the fifth row of subpixel units and the sixth row of subpixel units in the display panel to display at respective rows, the gate-driving circuit 20 enables the fourth-stage of shift-register unit, or subsequently the fifth-stage of shift-register unit, an so on, to drive all rows of subpixel units in the display panel to complete displaying one frame of image, until an end of the display period DS of the first frame 1F.

Additionally, during the display period DS of the first frame 1F, the gate-driving circuit 20 is also configured to charge the third node H. For example, when the fifth row of subpixel units needs compensation during its display operation within the first frame 1F, the compensation operation is carried out as following:

During the second period 2 and the third period 3 of the DS, the eleventh sub-clock signal line CLK_11 is configured to provide a same signal as the shift-register signal CR<5> outputted from the third-stage of shift-register unit 10, so as to turn on the first transistor M1. At the same time, the second input signal STU2 received by the third-stage of shift-register unit 10 can be configured to be the same as the shift-register signal CR<5>. Thus, the high voltage from the second input signal STU2 can be used to charge the third node H<5> to pull the voltage level of the third node H<5> to a high voltage level.

In an alternative embodiment, the second input signal STU2 received by the third-stage of shift-register unit 10 is optionally the same as a shift-register signal CR outputted from any other stage of shift-register unit, provided that, at the same time, the signal provided via the eleventh sub-clock signal line CLK_11 has a same signal timing as the second input signal STU2.

The high voltage at the third node H<5> can also be maintained all the time until a blank period BL of the first frame 1F starts. When the fifth row of subpixel units needs external compensation during the first frame 1F, the operation of the third-stage of shift-register unit in the gate-driving circuit is performed as following:

In a seventh period 7 (in BL) of the first frame 1F, due to a coupling effect of a first capacitor C1, the fourth node N<5> changes its voltage level from a low voltage to a high voltage, which pulls up the voltage level of the third node H<5>. Thus, the voltage level at the third node H<5> may be maintained at a relatively high level, ensuring that the second transistor M2 is fully in a conduction state. In this period, a first clock signal CLKA provided via the twelfth sub-clock signal line CLK_12 is changed from a high voltage signal to a low voltage signal. So, the fourth node N<5> is also turned into a low voltage. Because of the coupling effect of the first capacitor C1, the voltage level at the third node H<5> also is lowered.

In an eighth period 8 (in BL) of the first frame 1F, the third clock signal CLKC provided via the eighth sub-clock signal line CLK_8 is changed to a high voltage signal. The voltage level at the first node Q1<5> is pushed further higher by bootstrap effect to maintain the seventh transistor M7 in conduction state. Thus, the first output signal OUT1<5> outputted from the third-stage of shift-register unit 10 is changed to a high voltage signal. But because the fourth clock signal CLKD provided via the ninth sub-clock signal line CLK_9 is still a low voltage signal, the second output signal OUT2<6> outputted from the third-stage of shift-register unit 10 is a low voltage signal. In an example, the first output signal OUT1<5> in the eighth period 8 can be used to drive sensing transistors in subpixel units of the display panel to achieve the external compensation for driving the display panel to display a frame of image with uniform brightness.

In a ninth period 9 (in BL) of the first frame 1F, due to a charge-maintaining effect of the second capacitor C2, the first node Q1<5> still maintains at a high voltage so as to keep the seventh transistor M7 in conduction state. But, because the third clock signal CLKC provided via the eighth sub-clock signal line CLK_8 is changed to a low voltage signal. The first output signal OUT1<5> outputted from the third-stage of shift-register unit 10 also changes to a low voltage signal. At the same time, due to the bootstrap effect of the second capacitor C2, the voltage level at the first node Q1<5> also is lowered.

In a tenth period 10 (in BL) of the first frame 1F, the tenth sub-clock signal line CLK_10 and the eleventh sub-clock signal line CLK_11 both provide high voltage signals. The fortieth transistor M40 and the forty-first transistor M41 in every stage of shift-register unit 10 in the gate-driving circuit 20 are turned on. This allows the first node Q1 and the second node Q2 of every stage of shift-register unit 10 are reset in their voltage levels. Additionally, the first transistor M1 in every stage of shift-register unit 10 is turned on. Because the second input signal STU2 received at this time is a low voltage signal, it is an option to reset the voltage level of the third node H in every stage of shift-register unit, thereby completing a full-scale reset to the gate-driving circuit. Up to now, the first frame 1F ends. The driving operation of the gate-driving circuit in subsequent second frame, third frame, and so on, will be substantially the same. Descriptions will not be repeated.

In an embodiment, when the gate-driving circuit needs to output a driving signal for driving sensing transistors in a n-th row of subpixel units of a display panel in a blank period of one frame, the third node H needs to be pulled up to a high voltage level during the display period of the same one frame. At the same time, in the blank period of the one frame, high-voltage first clock signal CLKA needs to be provided to pull up voltage levels of the first node Q1 and the second node Q2. Then when the high voltage driving signal needs to be outputted, high voltage third clock signal CLKC or forth clock signal CLKD is needed. Here n is any positive integer. Optionally, two signals having a same timing means that they are synchronized in time but no need to be in a same signal amplitude.

Figure 16:
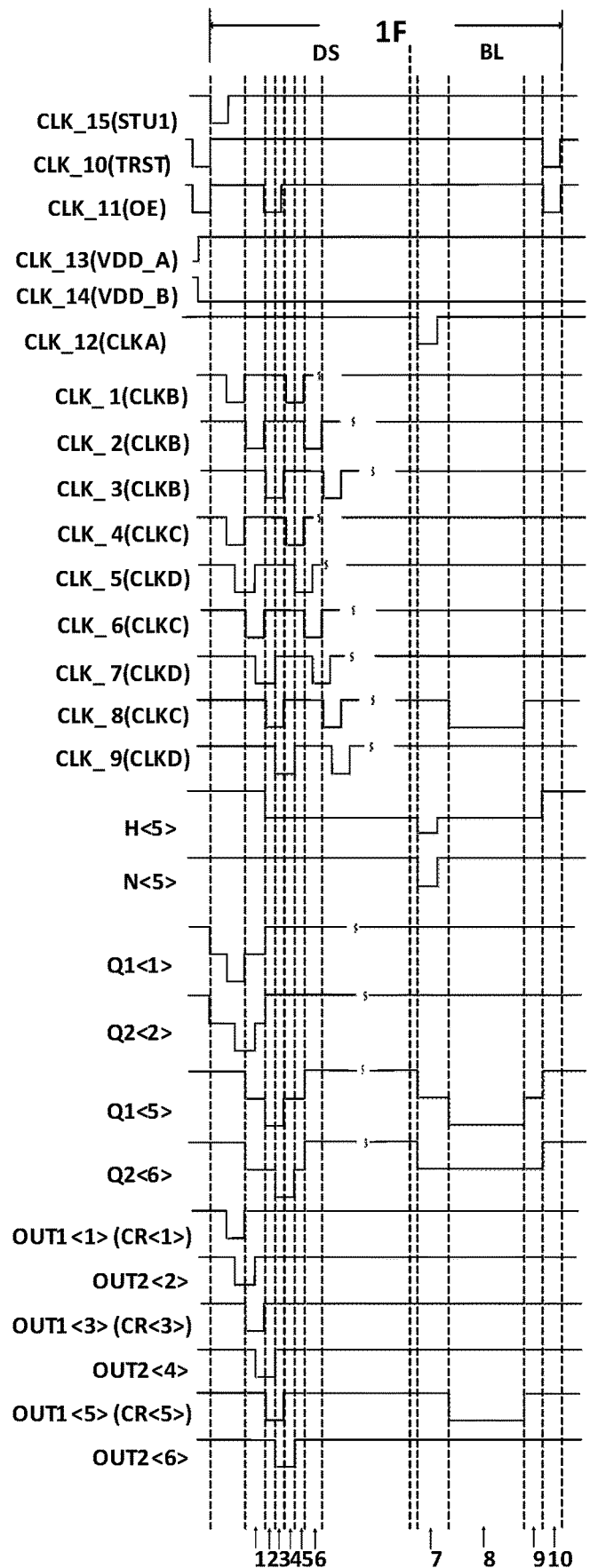
FIG. 16 is a timing diagram of operating a gate-driving circuit of FIG. 14 according to another embodiment of the present disclosure.

FIG. 16 is a timing diagram of operating a gate-driving circuit of FIG. 14 according to another embodiment of the present disclosure. In an embodiment, the gate-driving circuit 20 being operated according to the timing diagram is formed by cascading multiple shift-register units based on circuits shown in FIG. 13A and FIG. 13B. The timing sequences and operation principle are similar to the descriptions shown for FIG. 15.

Figure 17:
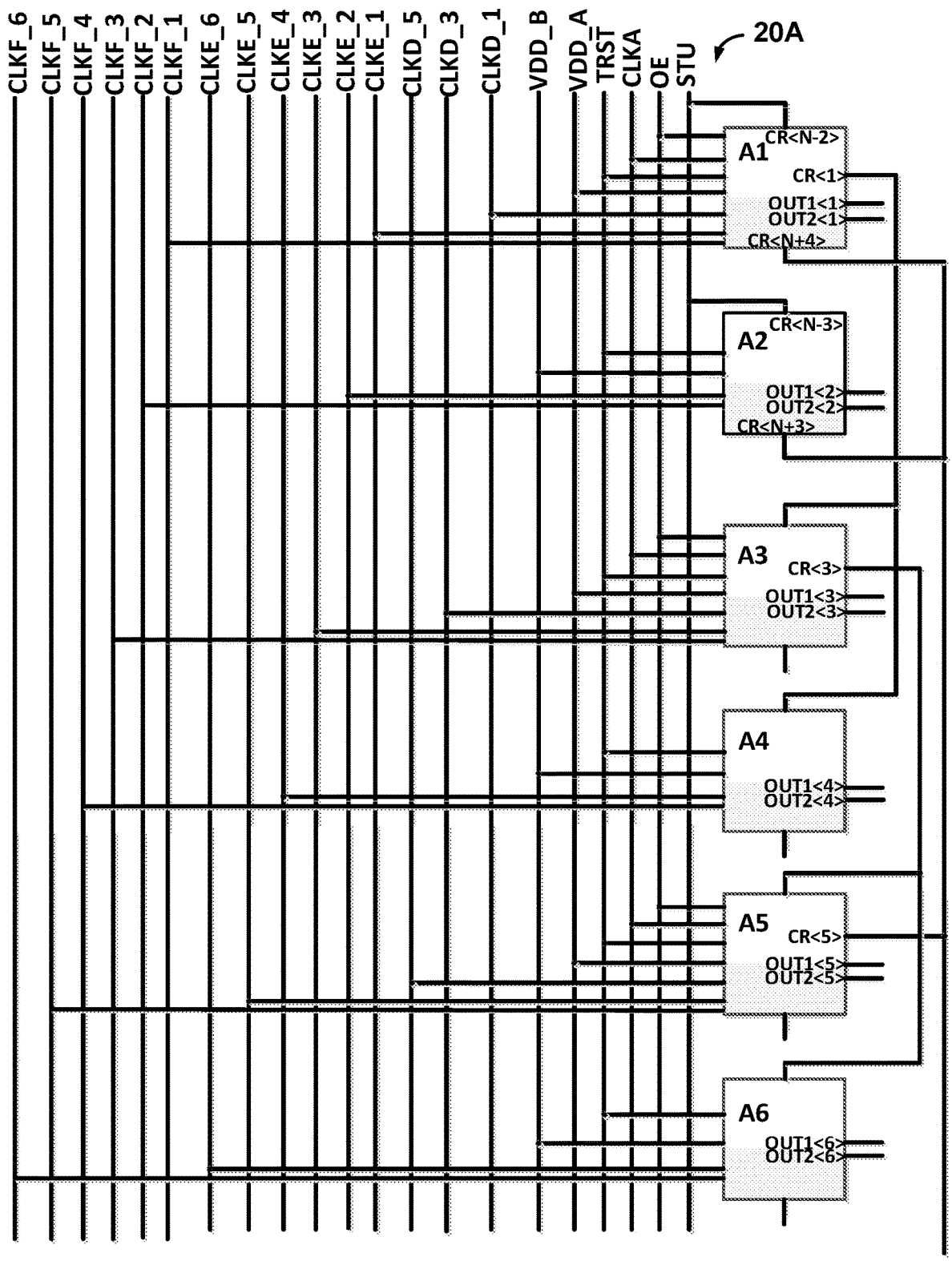
FIG. 17 is a schematic diagram of a gate-driving circuit according to another embodiment of the present disclosure.

FIG. 17 is a schematic diagram of a gate-driving circuit according to another embodiment of the present disclosure.

Figure 18:
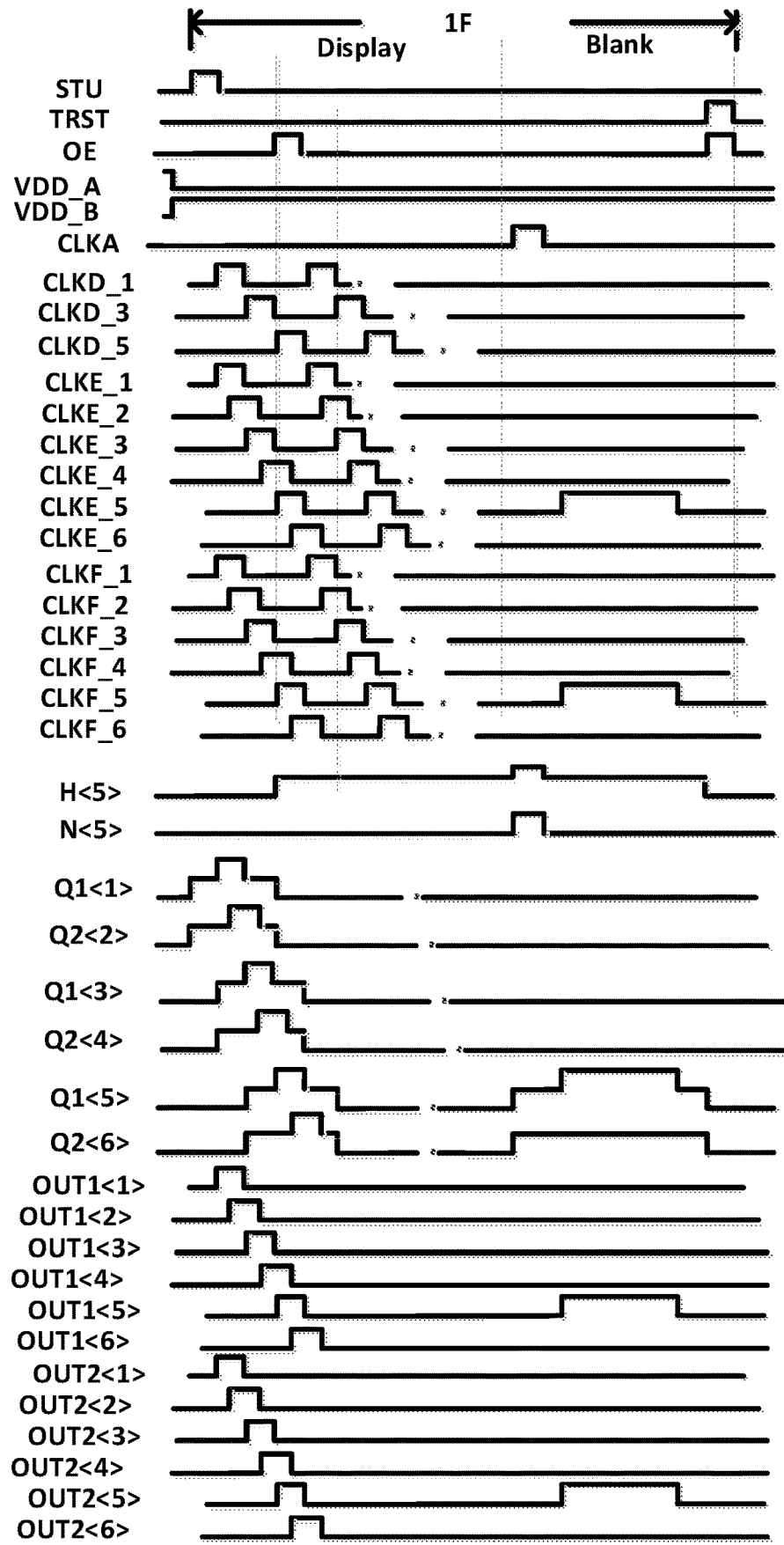
FIG. 18 is a timing diagram of operating a gate-driving circuit of FIG. 17 according to an embodiment of the present disclosure.

In the embodiment, a gate-driving circuit 20A is provided by cascading multiple shift-register units based on circuits shown in FIG. 11A or FIG. 12A and FIG. 11B or FIG. 12B. Each shift-register unit in odd-stage (e.g., A1, A3, A5) is configured to output a first output signal OUT1<N> in response to a clock signal from a clock-signal line CLKE_N (N=1, 3, 5) and a second output signal OUT2 in response to a clock signal from a clock-signal line CLKF_N (N=1, 3, 5). Unlike the odd-stage shift-register unit in the gate-driving circuit 20, it is only to output one output signal OUT1. Here, CLKE_1 is configured to supply the third clock signal CLKC (see FIG. 11A or 12A) and CLKF_1 is configured to supply the fifth clock signal CLKE (see FIG. 11A or 12A). Each shift-register unit in even-stage (e.g., A2, A4, A6) is configured to output a first output signal OUT1<N> in response to a clock signal from a clock-signal line CLKE_N (N=2, 4, 6) and a second output signal OUT2 in response to a clock signal from a clock-signal line CLKF_N (N=2, 4, 6). Unlike the even-stage shift-register unit in the gate driving circuit 20, it is only to output one output signal OUT2. Here, CLKE_2 is configured to supply a fourth clock signal CLKD (see FIG. 11B or 12B) and CLKF_2 is configured to supply a sixth clock signal CLKF (see FIG. 11B or 12B). FIG. 18 shows a timing diagram of operating the gate-driving circuit 20A according to an embodiment of the present disclosure. Referring to FIG. 18, the operation of the gate-driving circuit 20A adopts similar manner described for the gate-driving circuit 20 in FIG. 15, except that the waveforms of Q1<3> and Q2<4> are added in DS period of one frame 1F with substantially the same as those of Q1<1> and Q2<2> respectively except a shift in time determined by clock signals respectively in the clock-signal lines CLKE_4 and CLKF_4.

Figure 19:
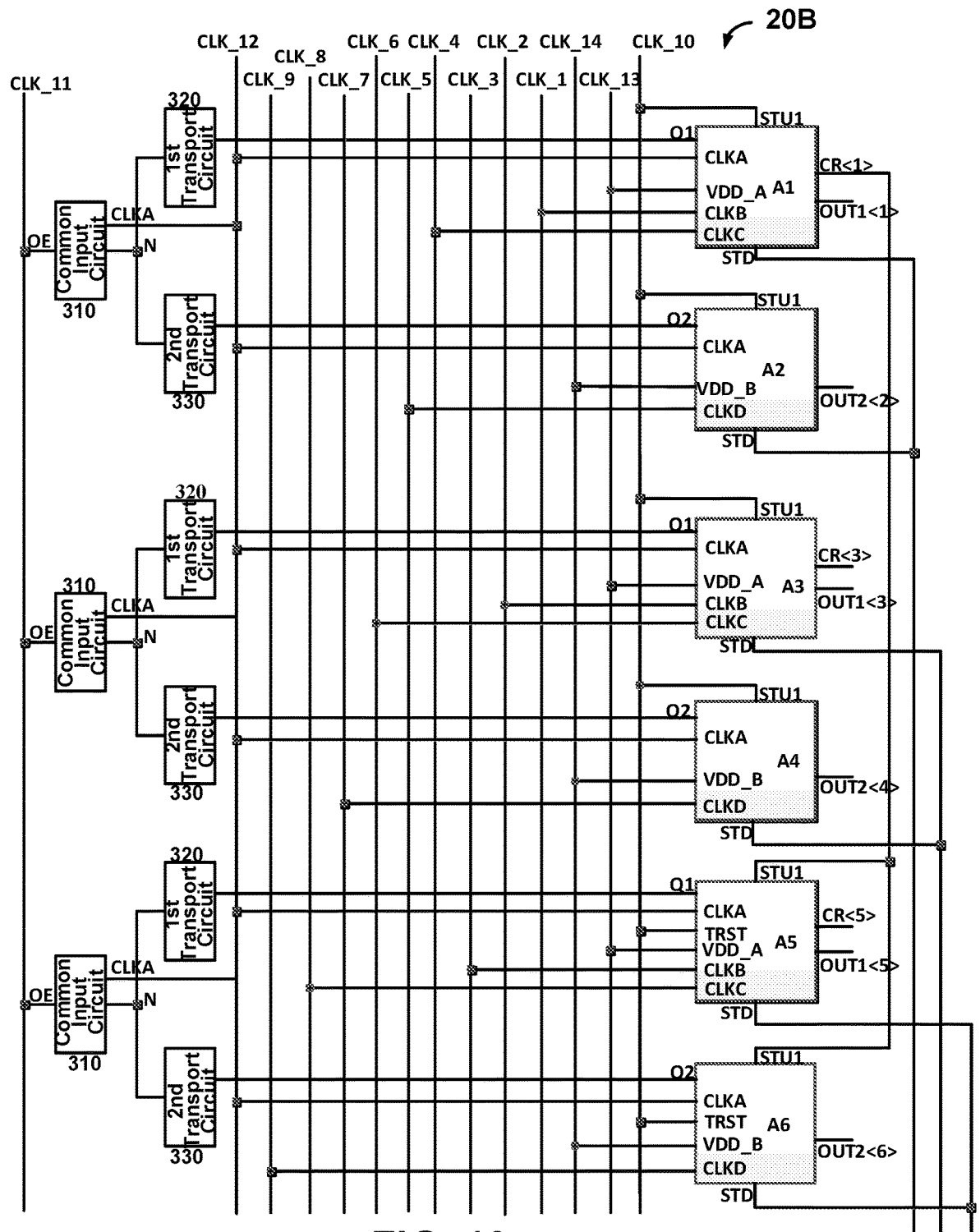
FIG. 19 is a schematic diagram of a gate-driving circuit according to another embodiment of the present disclosure.
Figure 20:
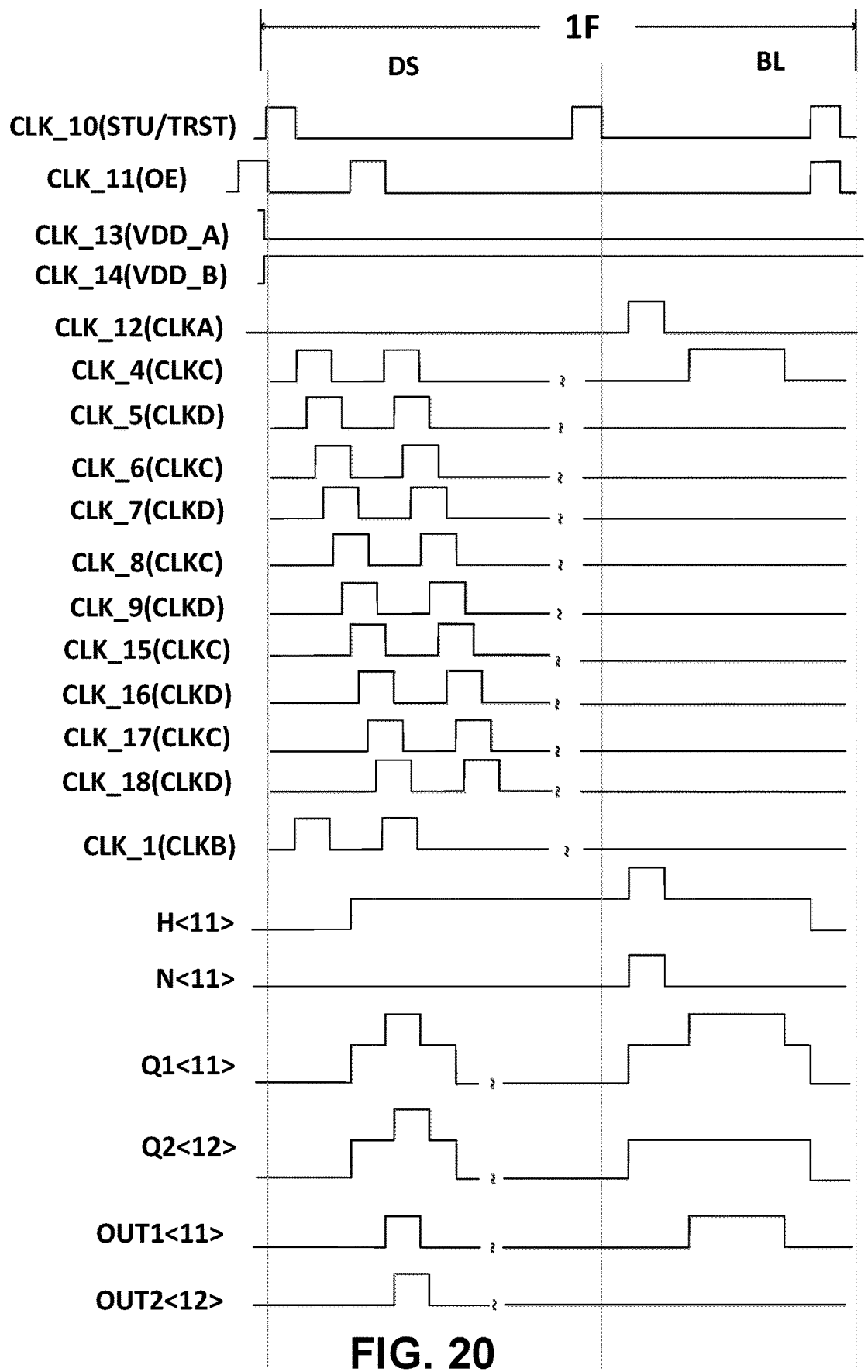
FIG. 20 is a timing diagram of operating a gate-driving circuit of FIG. 19 according to an embodiment of the present disclosure.

FIG. 19 is a schematic diagram of a gate-driving circuit according to another embodiment of the present disclosure. A gate-driving circuit 20B is provided as shown in FIG. 19. FIG. 20 shows a timing diagram of operating a gate-driving circuit of FIG. 19 according to an embodiment of the present disclosure. Some differences between the gate-driving circuit 20B of FIG. 19 and the gate-driving circuit 20 of FIG. 14 are shown below.

Referring to FIG. 19 and FIG. 20, in this embodiment, the gate-driving circuit 20B adopts 10 clock signal lines. The total 10 clock signal lines including the fourth sub-clock signal line CLK_4, the fifth sub-clock signal line CLK_5, the sixth sub-clock signal line CLK_6, the seventh sub-clock signal line CLK_7, the eighth sub-clock signal line CLK_8, the ninth sub-clock signal line CLK_9, the fifteenth sub-clock signal line CLK_15, the sixteenth sub-clock signal line CLK_16, the seventeenth sub-clock signal line CLK_17, and the eighteenth sub-clock signal line CLK_18, are employed to provide driving signals that are line-by-line outputted from respective stage of shift-register unit in the cascaded gate-driving circuit. In the embodiment, because of using 10 clock signal lines, the pre-charging time of each row of subpixel units is additionally increased so that the gate-driving circuit 20B is even more suitable for driving scanning display with higher frequency.

In the embodiment shown in FIG. 19 and FIG. 20, except first two stages of shift-register units in the cascaded series, each of other stages of shift-register units is configured to connect a first circuit each of previous two stages of shift-register units to receive a shift-register signal CR as its first input signal STU1. Except the last four stages of the shift-register units in the cascaded series, each of other stages of shift-register units is also connected to a first circuit in each of next four stages of the shift-register units to receive the shift-register signal CR as its display-reset signal STD.

Referring to FIG. 19, the tenth sub-clock signal line CLK_10 is connected to a first circuit and a second circuit of each of previous two stages of shift-register units (i.e., A1, A2, A3, and A4) to provide the first input signal STU1 (for the third-stage of shift-register unit, i.e., A5 and A6). At the same time, the tenth sub-clock signal line CLK_10 may be connected with any other stage of shift-register unit to provide a full-scale reset signal TRST. In this signal line layout, the number of clock signal lines can be saved to facilitate reduction of boarder frame size of the display apparatus that adopts the gate-driving circuit and enhance PPI of the display apparatus. In an example, for the first two stages of shift-register units, it is an option that the fortieth transistor M40 and the forty-first transistor M41 are not included.

Figure 21:
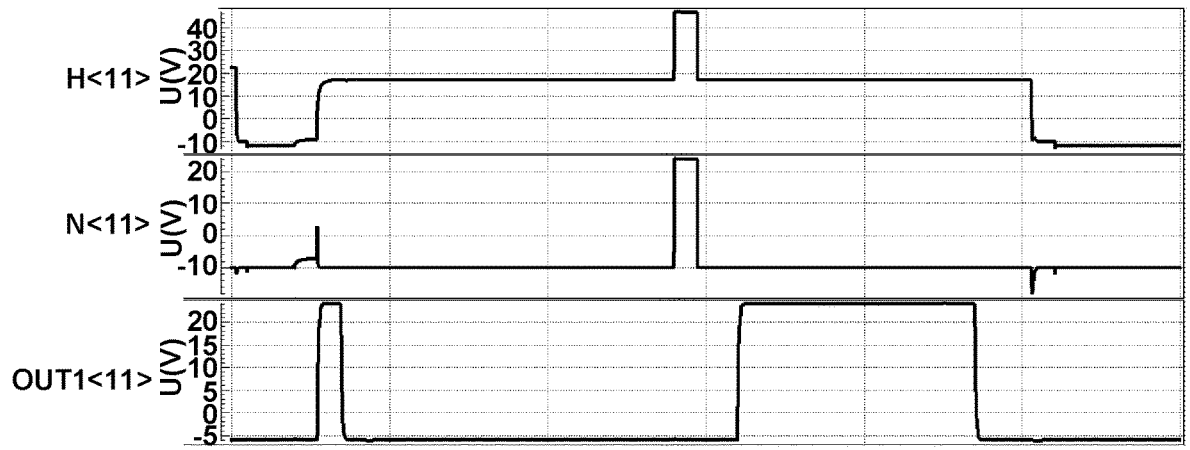
FIG. 21 is a signal diagram for simulated voltage signals at circuit nodes and output terminal of a gate-driving circuit according to an embodiment of the present disclosure.

Referring to FIG. 20, it is shown that an eleventh row of subpixel units is selected to perform external compensation and the eleventh row of subpixel units is corresponding to a sixth-stage of shift-register unit. In a display period DS of a first frame 1F, the third node H<11> is charged. In a blank period BL (following the display period), a high voltage first clock signal CLKA is provided to complete charging to the first node Q1<11> and the second node Q2<12>. Then, a high voltage signal provided via the fourth sub-clock signal line CLK_4 supplies the third clock signal CLKC in high voltage, making the first output signal OUT1<11> outputted from the sixth-stage of shift-register unit a high voltage signal. This high voltage signal OUT1<11> can be used to drive the eleventh row of subpixel units to complete their external compensation. FIG. 21 shows a simulation data of signals outputted from a gate-driving circuit of FIG. 19.

Figure 22:
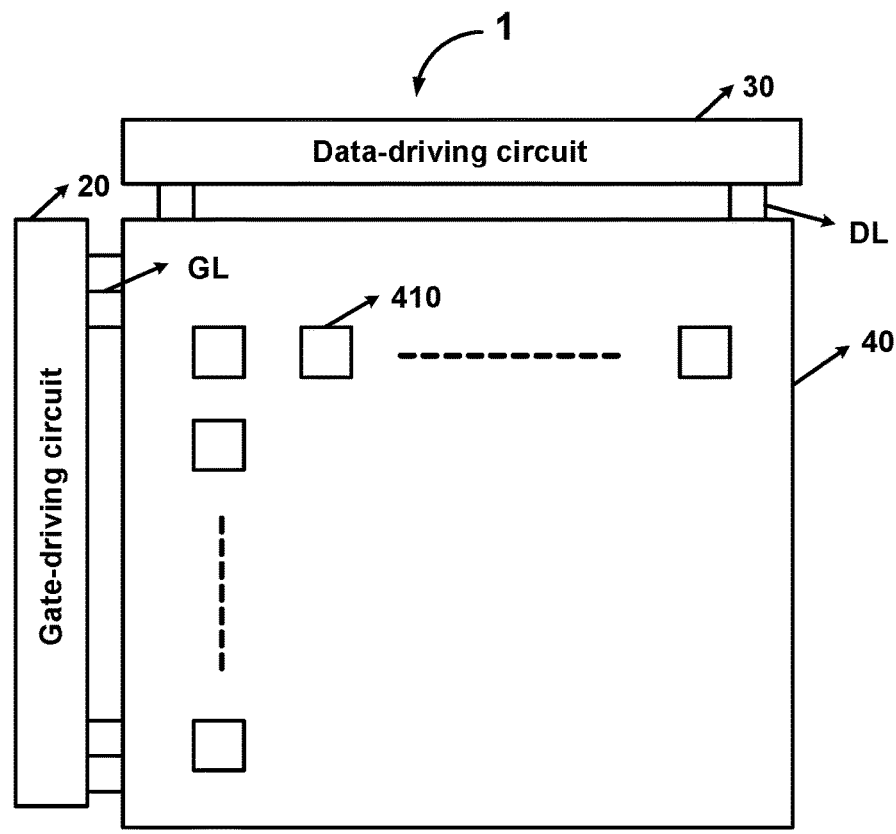
FIG. 22 is a schematic diagram of a display apparatus according to an embodiment of the present disclosure.

In another aspect, the present disclosure provides a display apparatus. FIG. 22 shows a schematic diagram of a display apparatus according to an embodiment of the present disclosure. The display apparatus 1 includes a gate-driving circuit 20 (or 20B) described in the present disclosure and multiple subpixel units 410 arranged in an array on a display panel 40.

In the gate-driving circuit 20, there are multiple shift-register units described in the present disclosure cascaded in series. A respective one shift-register unit outputs a first output signal OUT1 and a second output signal OUT2 respectively supplied for different rows of the subpixel units 410 in the array. For example, the gate-driving circuit 20 is connected to respective subpixel units 410 via gate lines GL. The gate-driving circuit 20 is used to provide driving signals to the array of subpixel units 410. For example, the driving signals are used respectively to drive scanning transistors and sensing transistors in a row of subpixel units 410.

In an embodiment, the display apparatus 1 also includes a data-driving circuit 30 configured to provide data signals to the array of subpixel units 410. Optionally, the data-driving circuit 30 is connected to respective subpixel units 410 via data lines DL.

Optionally, the display apparatus 1 of the present disclosure can be one selected from a liquid crystal display panel, a liquid-crystal TV, a displayer, an OLED display panel, an OLED TV, an electronic paper display apparatus, a smart phone, a tablet computer, a notebook computer, a digital-picture frame, a navigator, and any product or component having the display function.

In yet another aspect, the present disclosure provides a driving method for the shift-register unit described herein. The shift-register unit 10 shown in some figures of the specification can be used as a unit member for cascading a gate-driving circuit with multi-stages of shift-register units configured to drive a display panel to display at least one frame of image.

The driving method includes operating a first input circuit of a shift-register unit to control a voltage level at a first node connected between the first input circuit and a first output circuit in response to a first input signal. The method then includes making the first output circuit to output a shift-register signal and a first output signal in response to the voltage level at the first node. The driving method also includes operating a second input circuit of the shift-register unit to control a voltage level at a second node connected between the second input circuit and a second output circuit in response to the first input signal. The method then includes making the second output circuit to output a second output signal in response to the voltage level at the second node.

Optionally, in a specific embodiment, the method includes inputting a first input signal to a first input circuit of a first circuit of a shift-register unit described herein and a second input circuit of a second circuit of the same shift-register unit. The method further includes driving the first circuit to control a voltage level of a first node of the first circuit based on the first input signal. Additionally, the method includes coupling a first output circuit to the first node in the first circuit. The method further includes driving the first circuit to control the first output circuit to output a shift-register signal and a first output signal in response to the voltage level of the first node. Furthermore, the method includes driving the second circuit to control a voltage level of a second node of the second circuit based on the first input signal and coupling a second output circuit to the second node in the second circuit. Moreover, the method includes driving the second circuit to control the second output circuit to output a second output signal in response to the voltage level of the second node.

Optionally, the step of driving the first circuit to control a voltage level of the first node includes employing a blank-input circuit having a common input circuit to receive a second input signal and a first clock signal to determine a voltage level of a third node and a fourth node and a first transport circuit to control the voltage level of the first node in response to the voltage level of the fourth node. At the same time, the step of driving the second circuit to control a voltage level of the second node includes employing further a second transport circuit in the blank-input circuit to control the voltage level of the second node in response to the voltage level of the fourth node.

Optionally, the step of driving the first circuit to control the first output circuit includes using at least a first reset circuit and a second reset circuit to reset voltage levels at a shift-register output terminal and a first output terminal in the first output circuit. The step further includes controlling a second clock signal outputted as a shift-register signal and a third clock signal outputted as the first output signal in response to the voltage of the first node. Alternatively, the step of driving the second circuit to control the second output circuit includes using at least a third reset circuit to reset a voltage level at a second output terminal in the second output circuit. The step further includes controlling a fourth clock signal outputted as the second output signal in response to the voltage level of the second node.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A shift-register unit, comprising:
   a first circuit comprising a first input circuit coupled via a first node to a first output circuit, the first input circuit being configured to control a voltage level of the first node and the first output circuit being configured to output a first output signal in response to the voltage level of the first node;
   a second circuit comprising a second input circuit coupled via a second node to a second output circuit, the second input circuit being configured to control a voltage level of the second node and the second output circuit being configured to output a second output signal in response to the voltage level of the second node; and
   a blank-input circuit coupled to the first node and the second node, and being configured to receive a select-control signal to control voltage levels of the first node and the second node;
   wherein the first input circuit and the second input circuit have a same circuit structure;
   the first output signal and the second output signal are different from each other;
   the blank-input circuit comprises a common-input circuit, a first transport circuit, and a second transport circuit;
   the common-input circuit being configured to control a voltage level of a fourth node;
   the first transport circuit being coupled to the first node and the fourth node, and being configured to control the voltage level of the first node; and
   the second transport circuit being coupled to the second node and the fourth node, and being configured to control the voltage level of the second node.

2. The shift-register unit of claim 1, wherein the common-input circuit further comprises a select-control circuit and a third input circuit,
   the select-control circuit being configured to use a second input signal to control the voltage level of the third node in response to the select-control signal, and to maintain the voltage level of the third node; and
   the third input circuit being configured to control the voltage level of the fourth node in response to the voltage level of the third node.

3. The shift-register unit of claim 2, wherein the select-control circuit comprises a first transistor and a first capacitor, the first transistor having a gate terminal configured to receive the select-control signal, a first terminal configured to receive the second input signal, and a second terminal coupled to the third node, the first capacitor having a first terminal coupled to the third node.

4. The shift-register unit of claim 2, wherein the third input circuit comprises a second transistor having a gate coupled to the third node and a second terminal coupled to the fourth node.

5. The shift-register unit of claim 1, wherein the first input circuit comprises a fifth transistor and the first output circuit comprises a sixth transistor, a seventh transistor, and a second capacitor;
   the fifth transistor having a gate terminal configured to receive the first input signal and a second terminal coupled to the first node;
   the sixth transistor having a gate terminal coupled to the first node, a first terminal configured to receive a second clock signal as a shift-register signal, and a second terminal configured to output the shift-register signal;
   the seventh transistor having a gate terminal coupled to the first node, a first terminal configured to receive a third clock signal as the first output signal, and a second terminal configured to output the first output signal;
   the second capacitor having a first terminal coupled to the first node and a second terminal coupled to the second terminal of the seventh transistor.

6. The shift-register unit of claim 1, wherein the second input circuit comprises an eighth transistor and the second output circuit comprises a ninth transistor and a third capacitor;
   the eighth transistor having a gate terminal configured to receive the first input signal and a second terminal coupled to the second node;
   the ninth transistor having a fate terminal coupled to the second node, a first terminal configured to receive a fourth clock signal as the second output signal, and a second terminal configured to output the second output signal; and
   the third capacitor having a first terminal coupled to the second node and a second terminal coupled to the second terminal of the ninth transistor.

7. The shift-register unit of claim 4, wherein the first circuit further comprises a first control circuit, a first reset circuit, a second reset circuit, a shift-register output terminal, and a first output terminal;
   the first control circuit being configured to control a voltage level of a fifth node in response to the voltage level at the first node and a second voltage;
   the first reset circuit being configured to reset voltage levels at the first node, the shift-register output terminal, and the first output terminal in response to the voltage level at the fifth node; and
   the second reset circuit being configured to reset voltage levels at the first node, the shift-register output terminal, and the first output terminal in response to a voltage level at a sixth node.

8. The shift-register unit of claim 7, wherein the second circuit further comprises a second control circuit, a third reset circuit, a fourth reset circuit, and a second output terminal;
- the second output terminal being configured to output the second output signal;
- the second control circuit being configured to control the voltage level of the sixth node in response to the voltage level at the second node and a third voltage;
- the third reset circuit being configured to reset voltage levels at the second node and the second output terminal in response to the voltage level of the sixth node; and
- the fourth reset circuit being configured to reset voltage levels at the second node and the second output terminal in response to the voltage level of the fifth node.

9. The shift-register unit of claim 8, wherein the first circuit further comprises a third control circuit and a fourth control circuit; the third control circuit being configured to control the voltage level of the fifth node in response to a first clock signal and the fourth control circuit being configured to control the voltage level of the fifth node in response to the first input signal;
- the second circuit further comprises a fifth control circuit and a sixth control circuit; the fifth control circuit being configured to control the voltage level of the sixth node in response to the first clock signal and the sixth control circuit being configured to control the voltage level of the sixth node in response to the first input signal.

10. The shift-register unit of claim 9, wherein the first circuit further comprises a fifth reset circuit and a sixth reset circuit; the fifth reset circuit being configured to reset the voltage level at the first node in response to a display-reset signal and the sixth reset circuit being configured to reset the voltage level at the first node in response to a full-scale reset signal; and
- the second circuit further comprises a seventh reset circuit and an eighth reset circuit; the seventh reset circuit being configured to reset the voltage level at the second node in response to the display-reset signal and the eighth reset circuit being configured to reset the voltage level at the second node in response to the full-scale reset signal.

11. The shift-register unit of claim 1, wherein the voltage level of the first node is the same as the voltage level of the second node.

12. A gate-driving circuit comprising multiple shift-register units cascaded in series, each of the multiple shift-register units being the shift-register unit of claim 1 including a pair of first circuit in an odd stage and a second circuit in a next even stage respectively controlled by voltage levels of a first node and a second node, the voltage levels of the first node and the second node being respective controlled by a first transport circuit and a second transport circuit coupled commonly from a common-input circuit, wherein a first circuit of a respective shift-register unit outputs a shift-register signal as a first input signal to drive both the first circuit and the second circuit in a next shift-register unit or as a display-reset signal to drive both the first circuit and the second circuit in one before a previous shift-register unit.

13. The gate-driving circuit of claim 12, wherein the first input signal of at least one stage of first four stages of the gate-driving circuit is a clock signal.

14. The gate-driving circuit of claim 12, wherein the first input signal of at least one stage comprises a carry signal of a corresponding previous stage.

15. The gate-driving circuit of claim 12, wherein the common-input circuit further comprises a select-control circuit and a third input circuit; the select-control circuit being configured to use a second input signal to control a voltage level of a third node in response to the select-control signal, and to maintain the voltage level of the third node; and the second input signal of at least one stage comprises a carry signal of a corresponding previous stage.

16. A display apparatus comprising a gate-driving circuit of claim 12 and multiple subpixel units arranged in an array, wherein a first output signal and a second output signal respectively outputted from a first output circuit and a second output circuit of a respective one shift-register unit in the gate-driving circuit are provided respectively to subpixel units in different rows of the array.

17. A method of driving the shift-register unit of claim 1, comprising:
- inputting a first input signal to a first input circuit of a first circuit of the shift-register unit and a second input circuit of a second circuit of the same shift-register unit;
- driving the first circuit to control a voltage level of a first node of the first circuit based on the first input signal;
- coupling a first output circuit to the first node;
- driving the first circuit to control the first output circuit to output a shift-register signal and a first output signal;
- driving the second circuit to control a voltage level of a second node of the second circuit based on the first input signal;
- coupling a second output circuit to the second node; and
- driving the second circuit to control the second output circuit to output a second output signal;
- wherein driving the first circuit to control a voltage level of the first node comprises employing a blank-input circuit having a common input circuit to receive a second input signal and a first clock signal to determine a voltage level of a third node and a fourth node and a first transport circuit to control the voltage level of the first node; driving the second circuit to control a voltage level of the second node comprises employing the blank-input circuit further having a second transport circuit to control the voltage level of the second node.

* * * * *